(12) United States Patent
Kim et al.

(10) Patent No.: US 10,797,071 B2
(45) Date of Patent: Oct. 6, 2020

(54) SEMICONDUCTOR MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Jun Hyoung Kim, Hwaseong-si (KR); Kwang Soo Kim, Hwaseong-si (KR); Geun Won Lim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/251,337

(22) Filed: Jan. 18, 2019

(65) Prior Publication Data

US 2020/0020716 A1   Jan. 16, 2020

(30) Foreign Application Priority Data

Jul. 12, 2018 (KR) .................... 10-2018-0081149

(51) Int. Cl.

| | |
|---|---|
| *H01L 27/11582* | (2017.01) |
| *H01L 27/11573* | (2017.01) |
| *H01L 27/1157* | (2017.01) |
| *H01L 23/522* | (2006.01) |
| *H01L 23/528* | (2006.01) |
| *H01L 27/11565* | (2017.01) |
| *H01L 21/28* | (2006.01) |

(52) U.S. Cl.
CPC .... *H01L 27/11582* (2013.01); *H01L 23/5226* (2013.01); *H01L 23/5283* (2013.01); *H01L 27/1157* (2013.01); *H01L 27/11565* (2013.01); *H01L 27/11573* (2013.01); *H01L 29/40117* (2019.08)

(58) Field of Classification Search
CPC ......... H01L 27/11556; H01L 27/11558; H01L 27/11582; H01L 27/11524; H01L 27/1157; G11C 5/063
See application file for complete search history.

(56) References Cited

U.S. PATENT DOCUMENTS

| | | |
|---|---|---|
| 8,237,211 B2 | 8/2012 | Fukuzumi et al. |
| 8,318,602 B2 | 11/2012 | Kito et al. |
| 8,338,882 B2 | 12/2012 | Tanaka et al. |
| 9,646,981 B2 | 5/2017 | Nishikawa et al. |

(Continued)

FOREIGN PATENT DOCUMENTS

KR    10-2016-0108052 A    9/2016

*Primary Examiner* — Mohammed R Alam
(74) *Attorney, Agent, or Firm* — Lee IP Law, P.C.

(57) ABSTRACT

A semiconductor memory device includes a peripheral circuit structure including a peripheral circuit insulating layer, a middle connection structure on the peripheral circuit insulating layer, the middle connection structure including a middle connection insulating layer, and a bottom surface of the middle connection insulating layer is in contact with a top surface of the peripheral circuit insulating layer, stack structures on sides of the middle connection structure, and channel structures extending vertically through each of the stack structures, wherein at least one side surface of the middle connection insulating layer is an inclined surface, a lateral sectional area of the middle connection insulating layer decreasing in an upward direction oriented away from the peripheral circuit insulating layer.

20 Claims, 12 Drawing Sheets

(56) References Cited

U.S. PATENT DOCUMENTS

| | | |
|---|---|---|
| 9,741,733 B2 | 8/2017 | Lim et al. |
| 9,761,602 B2 | 9/2017 | Oh et al. |
| 9,818,693 B2 | 11/2017 | Toyama et al. |
| 2015/0325588 A1* | 11/2015 | Lee .................. H01L 27/11573 257/329 |
| 2017/0358593 A1 | 12/2017 | Yu et al. |

* cited by examiner

SEMICONDUCTOR MEMORY DEVICE AND METHOD OF MANUFACTURING THE SAME

CROSS-REFERENCE TO RELATED APPLICATION

Korean Patent Application No. 10-2018-0081149, filed on Jul. 12, 2018, in the Korean Intellectual Property Office, and entitled: "Semiconductor Memory Device and Method of Manufacturing the Same," is incorporated by reference herein in its entirety.

BACKGROUND

1. Field

Devices and methods consistent with example embodiments relate to a three-dimensional (3D) semiconductor memory device having improved integration density and reliability and a method of manufacturing the device.

2. Description of the Related Art

To manufacture electronic devices to be lightweight, thin, simple, and small-sized and to increase competitiveness in pricing, it is necessary to increase the integration density of semiconductor memory devices. In recent years, to overcome the integration limit of two-dimensional (2D) semiconductor memory devices, three-dimensional (3D) semiconductor memory devices including three-dimensionally arranged memory cells have been developed. A 3D semiconductor memory device includes a channel structure, which includes a plurality of vertically stacked layers and is formed to pass through a plurality of layers, to increase integration density. The 3D semiconductor memory device includes cell array regions and connection regions, and the connection regions are disposed between the cell array regions. A process of forming the connection regions using an etching process and a gap filling process may affect reliability of the 3D semiconductor memory device.

SUMMARY

According to example embodiments, there is provided a semiconductor memory device including a peripheral circuit structure having a peripheral circuit insulating layer, a middle connection structure disposed on the peripheral circuit insulating layer and including a middle connection insulating layer, stack structures disposed on sides of the middle connection structure, and channel structures formed to vertically pass through the stack structure. A bottom surface of the middle connection insulating layer is in contact with a top surface of the peripheral circuit insulating layer, and a lateral sectional area of the middle connection insulating layer is reduced upward such that at least one side surface of the middle connection insulating layer is formed as an inclined surface.

According to example embodiments, there is provided a semiconductor memory device including a peripheral circuit structure having a peripheral circuit insulating layer, a middle connection structure disposed on the peripheral circuit insulating layer and including a middle connection insulating layer, stack structures disposed on sides of the middle connection insulating layer above the peripheral circuit insulating layer, and channel structures formed to vertically pass through the stack structures. Each of the stack structures includes a plurality of layers, a bottom surface of a lowermost layer of each of the stack structures is in contact with a top surface of the peripheral circuit insulating layer, and a bottom surface of a second lowermost layer of each of the stack structures is in contact with a top surface of the lowermost layer and a side surface of the middle connection insulating layer.

According to example embodiments, there is provided a method of manufacturing a semiconductor memory device, the method including depositing a middle connection insulating layer on a top surface of a peripheral circuit insulating layer, forming stack structures on sides of the middle connection insulating layer, and forming channel structures configured to vertically pass through the stack structures. A bottom surface of the middle connection insulating layer is in contact with the top surface of the peripheral circuit insulating layer, and a lateral sectional area of the middle connection insulating layer is reduced upward such that at least one side surface of the middle connection insulating layer is formed as an inclined surface.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a semiconductor memory device and a method of manufacturing the same according to example embodiments will be described with reference to the accompanying drawings.

Figure 1:
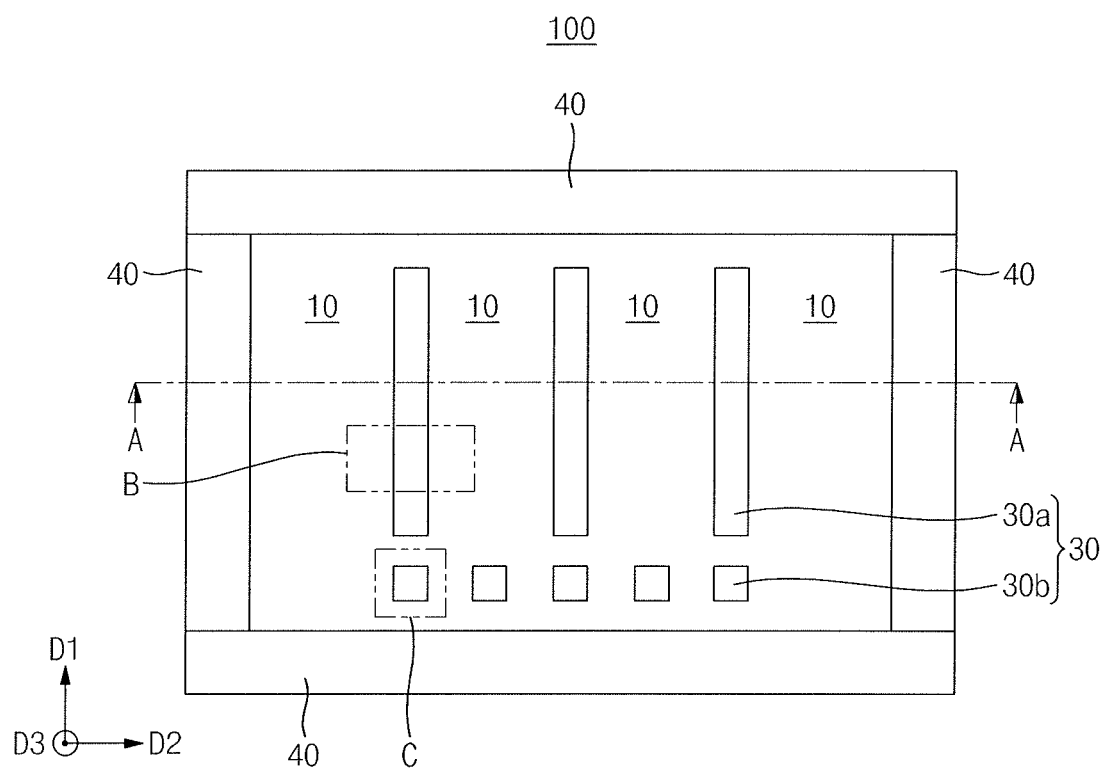
FIG. 1 illustrates a schematic plan view of a semiconductor memory device according to an example embodiment.
Figure 2:
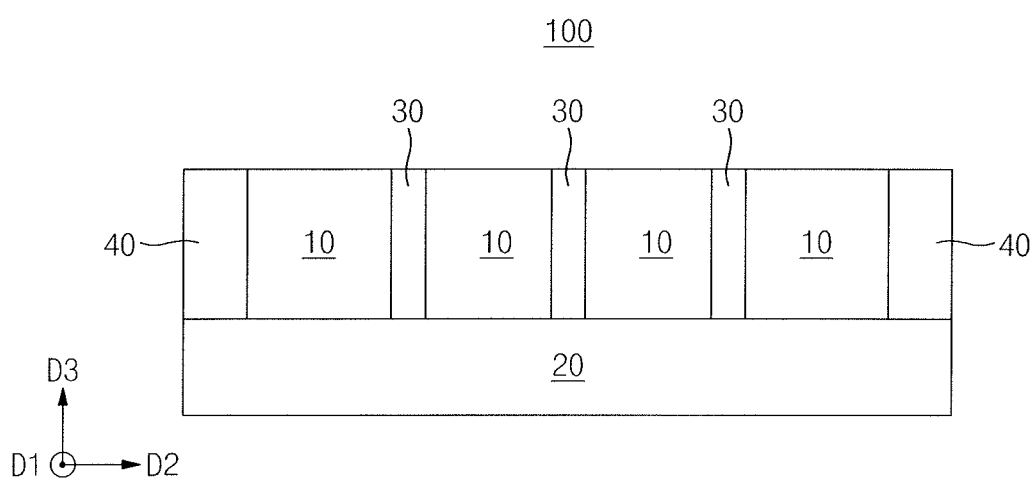
FIG. 2 illustrates a vertical sectional view taken along line A-A of FIG. 1.

FIG. 1 is a schematic plan view of a semiconductor memory device according to an example embodiment. FIG. 2 is a vertical sectional view taken along line A-A of FIG. 1.

Referring to FIGS. 1 and 2, a semiconductor memory device 100 according to the example embodiment may include cell array regions 10, a peripheral circuit region 20, middle connection regions 30, and peripheral connection regions 40.

Hereinafter, a first direction D1 will denote a direction in which one cell array region 10 extends, and a second direction D2 will denote a direction that is perpendicular to the first direction D1 and in which the cell array regions 10 are spaced apart from each other. A third direction D3 will be a direction that is perpendicular to the first direction D1 and the second direction D2, and in which the cell array regions 10 and the middle connection regions 30 are stacked on the peripheral circuit region 20. One lateral side and another lateral side will respectively denote the second direction D2 and an opposite direction thereof based on FIG. 1 (e.g., right and left sides of FIG. 1). A front side and a rear side will respectively denote the first direction D1 and an opposite direction thereof based on FIG. 1 (e.g., top and bottom of the structure in FIG. 1, respectively).

The semiconductor memory device 100 may be a three-dimensional (3D) semiconductor memory device. For example, the semiconductor memory device 100 may be a 3D NAND flash memory device. The semiconductor memory device 100 may have a cell-on-peripheral (COP) structure in which the cell array regions 10 and the middle connection regions 30 are stacked on the peripheral circuit region 20. The semiconductor memory device 100 may include the peripheral connection regions 40 formed on the peripheral circuit region 20.

The plurality of cell array regions 10 may be formed to extend in the first direction D1, and may be spaced apart from each other in the second direction D2. The peripheral circuit region 20 may be disposed under the cell array regions 10.

The middle connection regions 30 may be disposed between the cell array regions 10. The middle connection regions 30 may be formed to have different lengths and widths according to positions and purposes thereof. The middle connection regions 30 may be formed to have different areas according to positions and purposes thereof. For example, the middle connection regions 30 may include first middle connection regions 30a having a relatively large length along the first direction D1 and second middle connection regions 30b having a relatively small length along the first direction D1. The first middle connection regions 30a and the second middle connection regions 30b may be formed to have different widths or lengths from each other.

The first middle connection regions 30a may extend in the first direction D1, e.g., a longitudinal direction of the first middle connection region 30a may extend in the first direction D1, and may be spaced apart from each other in the second direction D2, e.g., each first middle connection region 30a may be between two cell array regions 10. For example, a first lateral side, a second lateral side, and a rear side of the first middle connection region 30a may be in, e.g., direct, contact with the cell array region 10, and a front side of the first middle connection region 30a may be in, e.g., direct, contact with the peripheral connection region 40. In another example, the front side of the first middle connection region 30a may not be in, e.g., direct, contact with the peripheral connection region 40 but may be formed to be spaced apart from the peripheral connection region 40 along the first direction D1, as illustrated in FIG. 1.

All side surfaces of the second middle connection region 30b may be in, e.g., direct, contact with the cell array region 10. The second middle connection region 30b may be spaced apart along the first direction D1 from the rear side of the first middle connection region 30a. The second middle connection regions 30b may be spaced apart from each other along the second direction D2, and may be spaced apart different distances from the first middle connection regions 30a. For example, as illustrated in FIG. 1, distances between adjacent second middle connection regions 30b in the second direction D2 may be different than distances between adjacent first middle connection regions 30a in the second direction D2. For example, as illustrated in FIG. 1, heights of the middle connection regions 30 and cell array regions 10 along the third direction D3 may be equal to each other.

The peripheral connection regions 40 may extend in the first direction D1 and be disposed on the first lateral side and the second lateral side of the cell array regions 10, e.g., two peripheral connection regions 40 may extend in the first direction D1 and be spaced apart from each other in the second direction D2 along the first and second lateral sides of the cell array regions 10. The peripheral connection regions 40 may be disposed on a front side and a rear side of the cell array region 10 in the first direction D1, e.g., two peripheral connection regions 40 may extend in the second direction D2 and be spaced apart from each other along the first direction D1 along the front and rear sides of the cell array regions 10. For example, as illustrated in FIG. 1, the peripheral connection regions 40 may define a frame surrounding, e.g., an entire perimeter of, the cell array regions 10.

Figure 3:
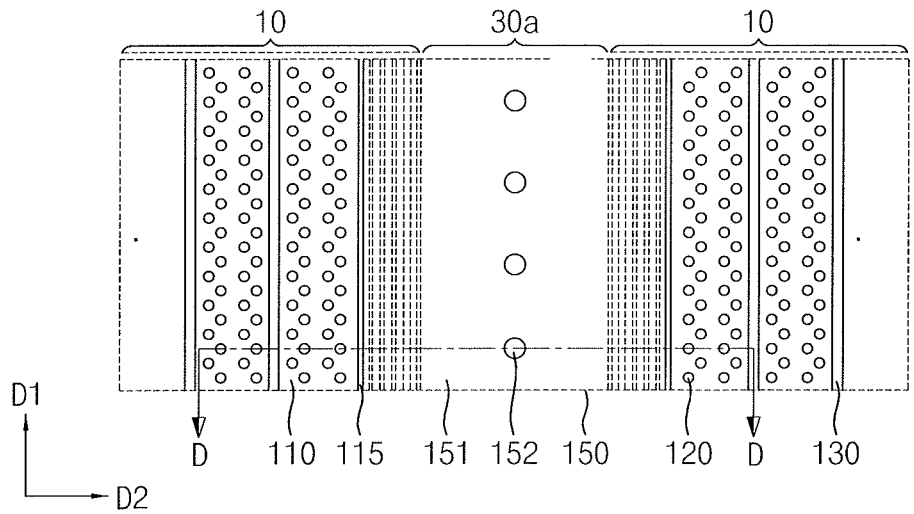
FIG. 3 illustrates an enlarged plan view of portion B of FIG. 1.

FIG. 3 is an enlarged plan view of a portion B of FIG. 1.

Referring to FIG. 3, the cell array regions 10 may include stack structures 110, channel structures 120, and common source lines (CSLs) 130. Each of the cell array regions 10 may include at least two common source lines 130. The stack structures 110 may extend in the first direction D1 and be stacked in the third direction D3. The channel structures 120 may be formed in the third direction D3 in the stack structures 110, and may be spaced apart from each other in the first direction D1 and the second direction D2. The stack structures 110 may further include isolation walls 115 disposed adjacent to the middle connection region 30, e.g., an isolation wall 115 may separate between the middle connection region 30 and an adjacent stack structure 110.

The middle connection region 30 may be disposed between the cell array regions 10 and include a middle connection structure 150. The middle connection region 30 may not be formed in a gate contact region of the cell array region 10. The middle connection structure 150 may include a middle connection insulating layer 151 and a middle connection contact 152. Although not specifically shown, the peripheral connection region 40 may have a structure similar to that of the middle connection region 30.

Figure 4A:
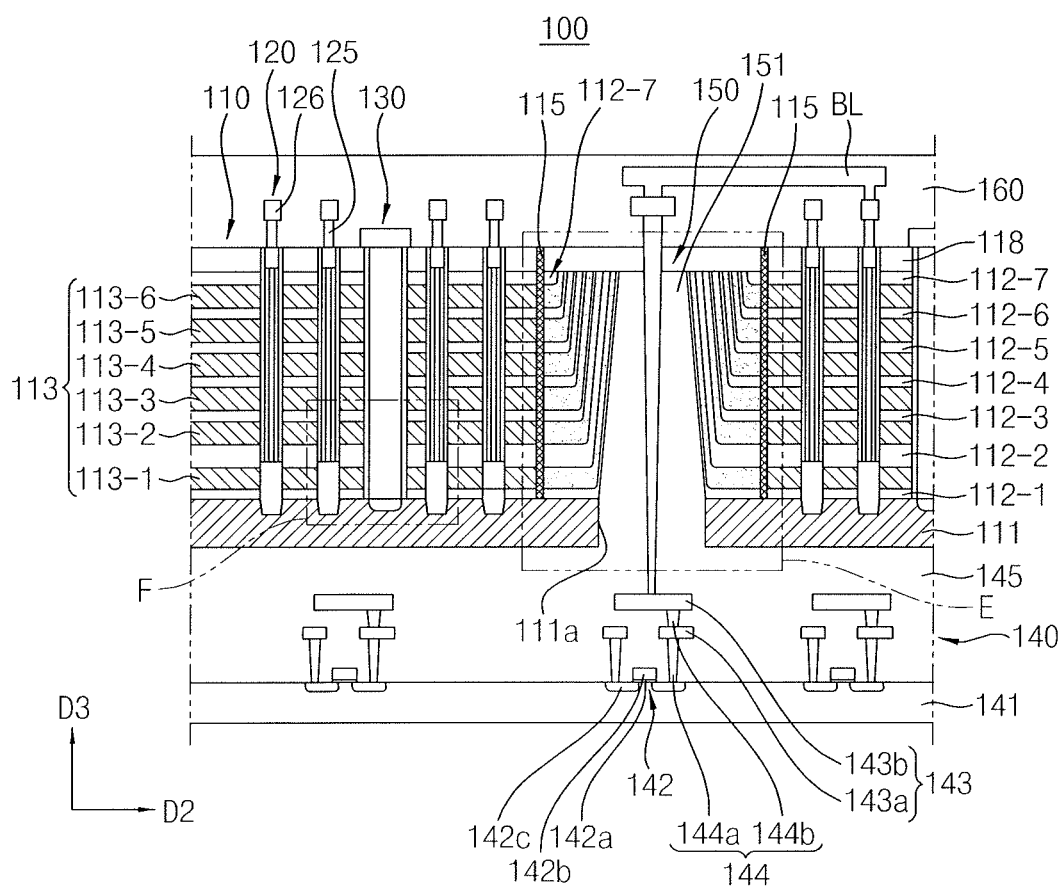
FIG. 4A illustrates a vertical sectional view taken along line D-D of FIG. 3.
Figure 4B:
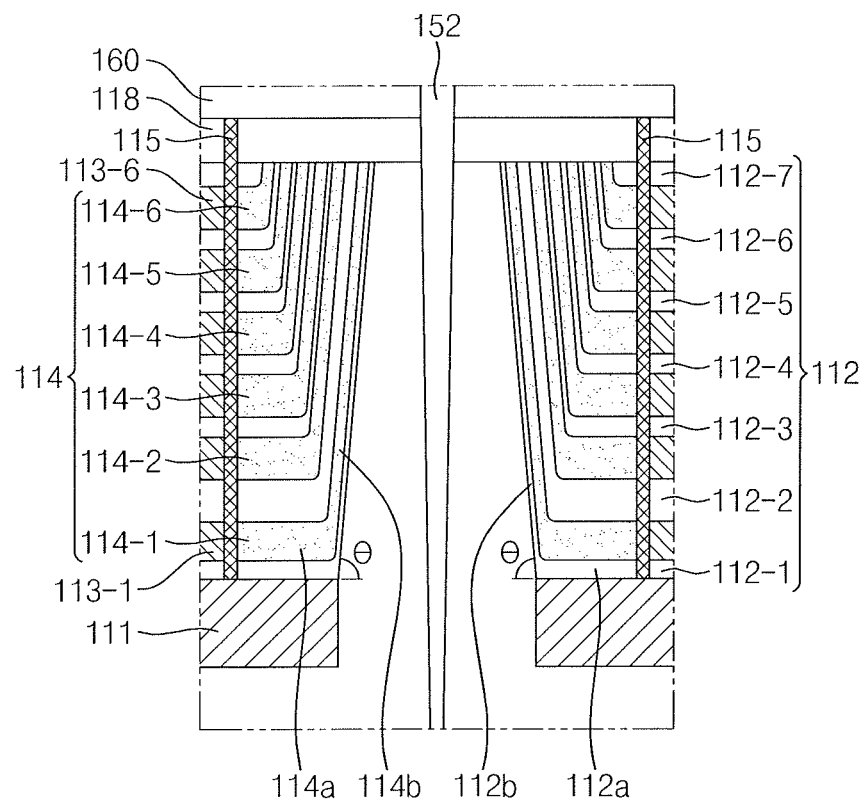
FIG. 4B illustrates an enlarged view of portion E of FIG. 4A.
Figure 4C:
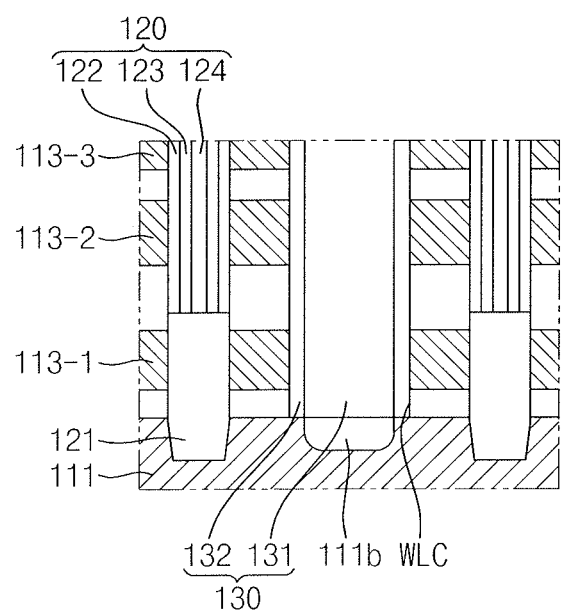
FIG. 4C illustrates an enlarged view of portion F of FIG. 4A.
Figure 5:
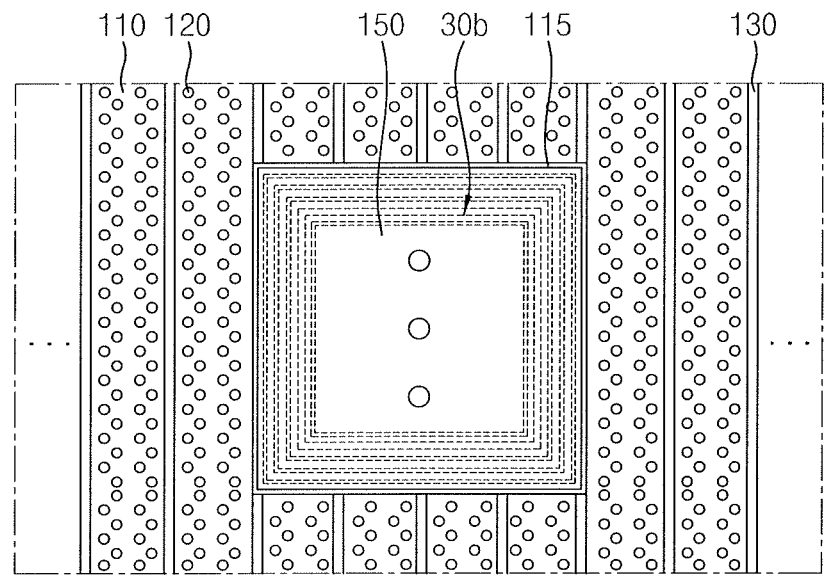
FIG. 5 illustrates an enlarged plan view of portion C of FIG. 1.

FIG. 4A is a vertical sectional view taken along line D-D of FIG. 3. FIG. 4B is an enlarged view of a portion E of FIG. 4A. FIG. 4C is an enlarged view of a portion F of FIG. 4A. FIG. 5 is an enlarged plan view of a portion C of FIG. 1.

Referring to FIGS. 3, 4A, and 4B, the semiconductor memory device 100 may include the stack structures 110, the channel structures 120, the common source lines 130, a peripheral circuit structure 140, and the middle connection structure 150. The semiconductor memory device 100 may further include a bit line BL. The stack structures 110, the channel structures 120, and the common source lines 130 may be disposed in the cell array region 10, and the peripheral circuit structure 140 may be disposed in the peripheral circuit region 20, e.g., under the stack structures 110. The middle connection structure 150 may be disposed in the middle connection region 30.

Referring to FIG. 3, the middle connection structure 150 may be disposed in the first middle connection region 30a, and the stack structures 110 may be disposed on both sides of the middle connection structure 150, e.g., as viewed in a cross sectional view of FIG. 4A. Further, referring to FIG. 5, the middle connection structure 150 may be formed in the second middle connection region 30b, and the stack structures 110 may be disposed on both lateral sides, a front side, and a rear side of the middle connection structure 150, e.g., around the perimeter. Hereinafter, a case in which the middle connection structure 150 is disposed in the first middle connection region 30a will mainly be described. In a case in which the middle connection structure 150 is disposed in the second middle connection region 30b, differences will mainly be described in comparison with the case in which the middle connection structure 150 is disposed in the first middle connection region 30a.

Referring to FIGS. 4A-4C, the stack structures 110 may include a sub-substrate 111, interlayer insulating layers 112, gate electrodes 113, and interlayer support layers 114. The stack structures 110 may further include the isolation walls 115. The stack structures 110 may further include a mold insulating layer 118 configured to surround and insulate a region including upper portions of the interlayer insulating layers 112, and an upper insulating layer 160 configured to insulate the bit line BL over the mold insulating layer 118. In the stack structure 110, the gate electrodes 113 may be formed at the same levels as the interlayer support layers 114, as illustrated in FIG. 4B. That is, the gate electrodes 113 may be replaced by the interlayer support layers 114. The stack structure 110 may be formed by stacking the gate electrodes 113 alternately with the interlayer insulating layers 112 and stacking the interlayer support layers 114 alternately with the interlayer insulating layers 112 on the sub-substrate 111.

The stack structure 110 may include a plurality of layers. A lowermost layer of the stack structure 110 may be the sub-substrate 111, and a second lowermost layer of the stack structure 110 may be the interlayer insulating layer 112, e.g., a lowermost interlayer insulating layer 112-1 of the interlayer insulating layers 112 may be directly on the sub-substrate 111. Further, the gate electrodes 113 and the interlayer insulating layers 112 may be alternately stacked on the interlayer insulating layer 112, e.g., on the lowermost interlayer insulating layer 112-1 of the interlayer insulating layers 112. A bottom surface of the sub-substrate 111, which is the lowermost layer of the stack structure 110, may be in contact with a top surface of a peripheral circuit insulating layer 145 included in the peripheral circuit structure 140. A bottom surface of the lowermost interlayer insulating layer 112-1 of the interlayer insulating layers 112, which is the second lowermost layer of the stack structure 110, may be in contact with a top surface of the sub-substrate 111 and side surfaces of the middle connection insulating layer 151 of the middle connection structure 150.

The sub-substrate 111 may include a semiconductor material. For example, the sub-substrate 111 may be a silicon (Si) single-crystalline substrate, a germanium (Ge) single crystalline substrate, or a silicon-germanium (SiGe) single-crystalline substrate. The sub-substrate 111 may be a P-type semiconductor substrate. The sub-substrate 111 may include P-type impurities, e.g., boron (B), gallium (G), or indium (In). The sub-substrate 111 is not limited to a P-type semiconductor substrate. The sub-substrate 111 may be a silicon-on-insulator (SOI) substrate.

Referring to FIGS. 2, 4A, and 4C, the sub-substrate 111 may include a semiconductor pattern 121 formed on the peripheral circuit region 20. The sub-substrate 111 may include a substrate trench 111a, which may have a predetermined width and extend in the first direction D1 through the sub-substrate 111. The substrate trench 111a may be formed at a position at which the middle connection structure 150 is formed. A lower portion of the middle connection structure 150 may be inserted into and combined with the substrate trench 111a. The substrate trench 111a may be formed in a shape corresponding to the lower portion of the middle connection structure 150. The substrate trench 111a may be formed in a shape extending in the first direction D1. Referring to FIGS. 3 and 5, the substrate trench 111a formed in the sub-substrate 111 may have a tetragonal shape in top view, e.g., corresponding to the first and second middle connection regions 30a and 30b of FIG. 1.

The sub-substrate 111 may include a common source region 111b, as illustrated in FIG. 4C. The common source region 111b may be formed in the sub-substrate 111 and extend in the first direction D1. The common source region 111b may have a conductive material which is different from that of the sub-substrate 111, e.g., may include N-type impurities such as arsenic (As) or phosphorus (P).

The interlayer insulating layers 112 may include a plurality of insulating layers, e.g., interlayer insulating layers 112-1, 112-2, 112-3, 112-4, 112-5, 112-6, and 112-7. The interlayer insulating layers 112 may be stacked on the sub-substrate 111 to be spaced apart from each other in the third direction D3. The interlayer insulating layer 112-7, which is an uppermost layer of the interlayer insulating layers 112, may function as an etch barrier layer. In this case, the interlayer insulating layer 112-7 may be formed of a material having an etch selectivity with respect to the middle connection insulating layer 151. Further, all of the interlayer insulating layers 112 may be formed of a material having an etch selectivity with respect to the middle connection insulating layer 151.

Each of the interlayer insulating layers 112 may include an insulating lateral portion 112a and an insulating inclined portion 112b, as illustrated in FIG. 4B. The insulating lateral portion 112a and the insulating inclined portion 112b may be sequentially formed toward the middle connection structure 150. For example, the insulating lateral portion 112a may be a portion formed parallel to the sub-substrate 111, and the insulating inclined portion 112b may extend from an edge of the insulating lateral portion 112a facing the middle connection structure 150 along, e.g., and in parallel to, a sidewall of the middle connection structure 150. For example, the insulating lateral portion 112a of the interlayer insulating layer 112-1, which is a lowermost layer of the interlayer insulating layers 112, may be in contact with the top surface of the sub-substrate 111.

In detail, the insulating inclined portion 112b may be a portion that is formed at an end portion of the insulating lateral portion 112a and inclined at a predetermined inclination angle θ with respect to a lateral direction. The inclination angle θ of the insulating inclined portion 112b may correspond to an inclination angle of a side surface of the middle connection insulating layer 151. The insulating inclined portion 112b may be a portion formed parallel to an inclined surface of the middle connection insulating layer 151. A first lateral side of the insulating inclined portion 112b may be connected to the edge of the insulating lateral portion 112a, while a second lateral side of the insulating inclined portion 112b may extend upward to be inclined at the inclination angle θ. For example, the insulating inclined portion 112b of the interlayer insulating layer 112-1, which is the lowermost layer of the interlayer insulating layer 112, may be in contact with both side surfaces of the middle connection insulating layer 151, e.g., may be in direct contact with a sidewall of the middle connection insulating layer 151 while completely surrounding the middle connection insulating layer 151. Further, referring to FIG. 5, the insulating inclined portion 112b may be in contact with both side surfaces, a front surface, and a rear surface of the middle connection insulating layer 151. The insulating inclined portion 112b may be stacked in a direction perpendicular to a side surface of the middle connection structure 150. A side-sectional surface of the insulating inclined portion 112b may be exposed at a top surface of the stack structure 110. The interlayer insulating layer 112 may include an insulating material, e.g., a silicon oxide film, a silicon nitride film, or a silicon oxynitride film.

The gate electrodes 113 may include a plurality of electrodes, e.g., gate electrodes 113-1, 113-2, 113-3, 113-4, 113-5, and 113-6. The gate electrodes 113 and the interlayer insulating layers 112 may be alternately stacked on the sub-substrate 111 along the third direction D3. The gate electrodes 113 may be electrically insulated from each other by the interlayer insulating layers 112. The gate electrode 113 may be disposed between the insulating lateral portions 112a of the interlayer insulating layers 112 and not be disposed between the insulating inclined portions 112b of the interlayer insulating layers 112, e.g., the gate electrodes 113 may extend only along the second direction D2 to end at the isolation walls 115. The gate electrodes 113 may include a conductive film. For instance, the gate electrodes 113 may include a semiconductor film (e.g., a silicon film doped with impurities), a metal silicide film (e.g., a cobalt silicide film, a nickel silicide film, a titanium silicide film, a tungsten silicide film, or a tantalum silicide film), a metal nitride film (e.g., a titanium nitride film, a tungsten nitride film, or a tantalum nitride film), a metal film (e.g., a tungsten film, a nickel film, a cobalt film, a titanium film, a ruthenium film, or a tantalum film), and/or a film formed of a combination thereof. The gate electrodes 113 may be combined with the channel structures 120 to constitute memory cells. Accordingly, the gate electrodes 113 may be used as control electrodes of memory cells arranged in an array in the cell array regions 10.

The interlayer support layers 114 may include a plurality of support layers, e.g., interlayer support layers 114-1, 114-2, 114-3, 114-4, 114-5, and 114-6. The interlayer support layers 114 may be disposed between the interlayer insulating layers 112, and between the gate electrodes 113 and the middle connection insulating layer 151. The interlayer support layers 114 may be stacked at the same level as the gate electrodes 113. The interlayer support layers 114 may be disposed between the interlayer insulating layers 112 outside the gate electrodes 113. The interlayer support layers 114 may support the interlayer insulating layers 112 during the formation of the gate electrodes 113.

In detail, as illustrated in FIG. 4B, each of the interlayer support layers 114 may include a support lateral portion 114a and a support inclined portion 114b. The support lateral portion 114a may be a portion formed parallel to the sub-substrate 111, e.g., and at a same level as a corresponding one of the gate electrodes 113, and the support inclined portion 114b may extend from the support lateral portion 114a along sidewalls of the middle connection insulating layer 151, e.g., between insulating inclined portions 112b.

In detail, the support lateral portion 114a may be a portion formed parallel to the insulating lateral portion 112a. The support lateral portion 114a may be formed between the insulating lateral portions 112a, e.g., the support lateral portions 114a may be aligned along the second and third directions D2 and D3 with corresponding gate electrodes 113 on opposite sides of the isolation walls 115 (FIG. 4B).

The support inclined portion 114b may be a portion formed to be inclined at a predetermined inclination angle θ with respect to a lateral direction toward the third direction D3. The inclination angle θ of the support inclined portion 114b may correspond to the inclination angle of the side surface of the middle connection insulating layer 151. The support inclined portion 114b may be disposed between the insulating inclined portions 112b. A first lateral side of the support inclined portion 114b may be connected to the support lateral portion 114a, while a second lateral side of the support inclined portion 114b may extend in an upward direction to be inclined at the inclination angle θ. The inclination angle θ of the support inclined portion 114b may correspond to an inclination angle of a side surface of the middle connection structure 150. The support inclined portions 114b may be stacked in a direction perpendicular to the side surface of the middle connection structure 150, e.g., the support inclined portions 114b and the insulating inclined portions 112b may alternate from the sidewall of the middle connection structure 150. A side-sectional surface of the support inclined portion 114b may be exposed at the top surface of the stack structure 110.

The interlayer support layers 114 may be formed from interlayer sacrificial layers 114d (FIG. 6G) or the gate electrodes 113 depending on a time point in which the isolation walls 115 are formed. For example, when the isolation walls 115 are formed and the interlayer sacrificial layers 114d are removed, the interlayer support layers 114 may be formed by leaving the interlayer sacrificial layers 114d. Further, when the gate electrodes 113 are formed and the isolation walls 115 are formed, the interlayer support layers 114 may be formed from the gate electrodes 113. In this case, the interlayer support layers 114 may be electrically isolated from the gate electrodes 113 by the isolation walls 115.

The isolation walls 115 may be formed to vertically pass through the interlayer insulating layers 112, i.e., along the third direction D3, between the gate electrodes 113 and the interlayer support layers 114. Each of the isolation walls 115 may be formed in the shape of a wall body configured to isolate the gate electrode 113 from the interlayer support layer 114. The isolation walls 115 may extend to the top surface of the sub-substrate 111 or to a predetermined depth from the top surface of the sub-substrate 111.

The isolation walls 115 may prevent the gate electrodes 113 from being formed between the insulating inclined portions 112b of the interlayer insulating layers 112. Referring to FIG. 3, the isolation walls 115 may be formed as a bar-type wall body along both sides of the middle connection insulating layer 151, e.g., extend along the first direction D1 and be spaced apart from each other along the second direction D2. Further, referring to FIG. 5, the isolation wall 115 may be formed as a wall body having a tetragonal, e.g., continuous, ring shape along a circumference of the middle connection insulating layer 151 of the second middle connection region 30b. The isolation walls 115 may prevent the gate electrodes 113 from being formed between the insulating inclined portions 112b of the interlayer insulating layers 112.

Since the insulating inclined portion 112b has a thickness smaller than that of the insulating lateral portion 112a, if the gate electrodes 113 were to be formed between the insulating inclined portions 112b, a short could have occurred between the gate electrodes 113 due to the thin thickness of the insulating inclined portions 112b. Further, side-sectional surfaces of the gate electrodes 113 could have been exposed at the top surface of the stack structure 110 and electrically connected to other patterns. In contrast, according to example embodiments, the gate electrodes 113 are formed only between the insulating lateral portions 112a, and the isolation walls 115 prevent the gate electrodes 113 from being formed between the thin insulating inclined portions 112b of the interlayer insulating layers 112.

The formation of the isolation walls 115 may include forming isolation cuts IC passing through the interlayer insulating layers 112 and filling the isolation cuts IC with an insulating material using, e.g., an atomic layer deposition (ALD) process, as will be described in more detail below with reference to FIGS. 6H-6I. The isolation cuts IC may be formed in a trench type, which may be formed to pass through the stack structure 110 and extend in the first direction D1 and the third direction D3. The isolation cuts IC may be formed on the top surface of the sub-substrate 111 or etched to a predetermined depth from the top surface of the sub-substrate 111. The isolation walls 115 may be formed of a material having an etch selectivity with respect to the interlayer support layers 114. The isolation walls 115 may be formed of an oxide film or a nitride film. The isolation walls 115 may include an insulating material, e.g., a silicon oxide film, a silicon nitride film, or a silicon oxynitride film.

Referring to FIGS. 3 and 4A-4C, the channel structures 120 may extend in the third direction D3 and be formed to vertically pass through the stack structure 110 (FIG. 4A). A plurality of channel structures 120 may be arranged in the cell array regions 10 in the first direction D1 and the second direction D2. As illustrated in FIG. 3, the channel structures 120 may be arranged to zigzag in the first direction D1 and be adjacent to each other in the second direction D2.

The channel structure 120 may include various layer structures formed outside a central axis of the channel structure 120. For example, as illustrated in FIG. 4C, the channel structure 120 may include an information storage pattern 122, a channel pattern 123, and a buried insulating pattern 124 in order from the outside of the channel structure 120 to the inside thereof. The channel structure 120 may further include the semiconductor pattern 121, a conductive pad 125, and a bit contact 126.

The semiconductor pattern 121 may be disposed in a lowermost portion of the channel structure 120. The semiconductor pattern 121 may be in direct contact with the sub-substrate 111 and electrically connected to the sub-substrate 111. A portion of the semiconductor pattern 121 may be buried in the sub-substrate 111, while another portion of the semiconductor pattern 121 may have a circular pillar shape that vertically protrudes from the top surface of the sub-substrate 111. The semiconductor pattern 121 may include, e.g., silicon (Si). The semiconductor pattern 121 may be an epitaxial pattern including, e.g., single-crystalline silicon or polycrystalline silicon. The semiconductor pattern 121 may include, e.g., germanium (Ge), silicon germanium (SiGe), a Group III-V semiconductor compound, or a Group II-VI semiconductor compound. The semiconductor pattern 121 may be an undoped pattern without having impurities or a pattern doped with impurities of the same conductivity type as that of the sub-substrate 111.

The information storage pattern 122 may be disposed on a top surface of the semiconductor pattern 121 or the top surface of the sub-substrate 111, and extend in the third direction D3, e.g., along an inner sidewall of the channel structure 120. The information storage pattern 122 may have a pipe shape having a hollow inner portion and open upper and lower ends. The lower end of the information storage pattern 122 may be in contact with the semiconductor pattern 121 or the sub-substrate 111. The information storage pattern 122 may include a thin film configured to store data.

The channel pattern 123 may be disposed on the top surface of the semiconductor pattern 121 or the top surface of the sub-substrate 111, and extend in the third direction D3, e.g., along the information storage pattern 122. The channel pattern 123 may have a pipe shape having a hollow inner portion and open upper and lower ends. The lower end of the channel pattern 123 may be in contact with and electrically connected to the semiconductor pattern 121 or the sub-substrate 111. An outer circumferential surface of the channel pattern 123 may be in contact with an inner circumferential surface of the information storage pattern 122. The channel pattern 123 may include at least one of, e.g., silicon (Si), germanium (Ge), silicon germanium (SiGe), gallium arsenic (GaAs), indium gallium arsenide (InGaAs), aluminum gallium arsenide (AlGaAs), or a mixture thereof. The channel pattern 123 may include an undoped semiconductor material without having impurities or a semiconductor material doped with impurities of the same conductivity type as that of the sub-substrate 111.

The buried insulating pattern 124 may be disposed on the top surface of the semiconductor pattern 121 or the top surface of the sub-substrate 111 and extend in the third direction D3. The buried insulating pattern 124 may be formed to fill a vacant space formed in the channel pattern 123. The buried insulating pattern 124 may be formed in a cylindrical shape. An outer circumferential surface of the buried insulating pattern 124 may be in contact with the channel pattern 123. The buried insulating pattern 124 may be formed of, e.g., a silicon oxide film or a silicon nitride film.

The conductive pad 125 may be disposed on the channel pattern 123. The conductive pad 125 may be formed on the buried insulating pattern 124. The conductive pad 125 may include a conductive material. The conductive pad 125 may be omitted.

The bit contact 126 may be formed to extend upward from a top surface of the conductive pad 125. The bit contact 126 may electrically connect the conductive pad 125 with the bit line BL. The bit contact 126 may include a conductive material, e.g., doped silicon, a metal silicide, or a metal.

The common source line 130 may include a common source plug 131 and common source spacers 132. The common source line 130 may be disposed between cell blocks. The common source line 130 may be disposed inside a word line cut WLC (FIG. 4C). The word line cut WLC may be formed by etching the stack structure 110 in the first direction D1. More specifically, the word line cut WLC may be formed as a type of a trench which may be formed to pass through the stack structure 110 and extend in the first direction D1. The word line cut WLC may be formed on the top surface of the sub-substrate 111 or etched to a predetermined depth from the top surface of the sub-substrate 111. The common source line 130 may extend to the common source region 111b of the sub-substrate 111 and be electrically connected to the common source region 111b.

The common source plug 131 may extend in the first direction D1 along the common source region 111b in the word line cut WLC. The common source plug 131 may extend to an upper portion of the stack structure 110 from the common source region 111b. The common source plug 131 may be formed to have a wall structure. When viewed from above, the common source plug 131 may be formed in a bar type extending in the first direction D1, e.g., within the common source line 130 illustrated in FIG. 3. The common source plug 131 may include a conductive material, e.g., tungsten, copper, titanium, titanium nitride, tantalum, tantalum nitride, silicon, or aluminum.

As illustrated in FIG. 4C, the common source spacers 132 may be formed between inner side surfaces of the word line cut WLC and the common source plug 131. The common source spacers 132 may, e.g., continuously, fill a space between the, e.g., entire, common source plug 131 and the stack structure 110. The common source spacers 132 may cover sidewalls of the stack structure 110. The common source spacers 132 may electrically insulate the common source plug 131 from the gate electrode 113 of the stack structure 110. The common source spacers 132 may include, e.g., silicon oxide, silicon nitride, silicon oxynitride, or a low-k dielectric material.

As illustrated in FIG. 4A, the bit line BL may be formed in upper portions of the cell array region 10 and the middle connection region 30 or in an upper portion of the peripheral circuit region 20. The bit line BL may be in contact with an upper portion of the bit contact 126 of the channel structure 120 and electrically connected to the channel structure 120. The bit line BL may include a conductive metal, e.g., aluminum, copper, or tungsten.

As further illustrated in FIG. 4A, the peripheral circuit structure 140 may include a main substrate 141, a peripheral transistor 142, a peripheral circuit interconnection 143, a peripheral circuit contact 144, and a peripheral circuit insulating layer 145.

The main substrate 141 may include a semiconductor substrate, e.g., a silicon wafer. The main substrate 141 may be formed of the same material as the sub-substrate 111. The main substrate 141 may be formed to have an area larger than that of the sub-substrate 111, and the entire sub-substrate 111 may overlap at least a portion of the main substrate 141. Although not specifically shown, the main substrate 141 may include a device isolation film formed between the peripheral transistors 142 to electrically insulate the peripheral transistors 142.

The peripheral transistor 142 may include a peripheral gate insulating film 142a, a peripheral gate electrode 142b, and source and drain regions 142c. The peripheral transistor 142 may further include peripheral gate spacers. The peripheral gate electrode 142b may be disposed on the peripheral gate insulating film 142a. The peripheral gate electrode 142b may include, e.g., silicon, a metal silicide, nickel silicide, cobalt silicide, titanium silicide, tantalum silicide (TaSi), or a metal. The source and drain regions 142c may be disposed in the main substrate 141 and include N-type impurities (e.g., phosphorus (P)) or P-type impurities (e.g., boron (B)). A plurality of peripheral transistors 142 may be formed in the peripheral circuit region 20. The peripheral transistor 142 may include a high-voltage or low-voltage transistor.

The peripheral circuit interconnection 143 may include a metal interconnection deposited on the main substrate 141. The peripheral circuit interconnection 143 may be formed in a line shape or a pad shape extending in the first direction D1 or the second direction D2. The peripheral circuit interconnection 143 may be formed at various positions according to a position of the peripheral transistor 142. The peripheral circuit interconnection 143 may include a lower circuit interconnection 143a and an upper circuit interconnection 143b, which are sequentially deposited above the main substrate 141. A plurality of peripheral circuit interconnections 143 may be formed in various shapes and numbers at various positions according to positions and numbers of the peripheral transistors 142.

The peripheral circuit contact 144 may include a metal contact deposited on the main substrate 141. The peripheral circuit contact 144 may be formed in a type of via extending in the third direction D3. The peripheral circuit contact 144 may include a lower circuit contact 144a and an upper circuit contact 144b which are sequentially deposited on the main substrate 141. The lower circuit contact 144a may be in contact with and electrically connected to the peripheral transistor 142 and the lower circuit interconnection 143a. The upper circuit contact 144b may be in contact with and electrically connected to the lower circuit interconnection 143a and the upper circuit interconnection 143b. A plurality of peripheral circuit contacts 144 may be formed at various positions in various shapes according to positions of the peripheral transistor 142.

The peripheral circuit insulating layer 145 may be formed on the main substrate 141 to cover the peripheral transistors 142, the peripheral circuit interconnections 143, and the peripheral circuit contacts 144. The peripheral circuit insulating layer 145 may be formed between the main substrate 141 and the sub-substrate 111. Although not specifically shown, the peripheral circuit insulating layer 145 may include a plurality of insulating layers according to the number of layers of the peripheral circuit interconnection 143. The peripheral circuit insulating layer 145 may be formed of, e.g., a silicon oxide film or low-k dielectric material.

The middle connection structure 150 may include the middle connection insulating layer 151 and the middle connection contact 152. The middle connection structure 150 may be disposed in the middle connection region 30. Referring to FIG. 1, the middle connection region 30 may be formed to have a different lateral area according to position. Accordingly, the middle connection structure 150 may also be formed to have a different lateral area according to the lateral area of the middle connection region 30. Hereinafter, FIG. 3 illustrates the middle connection structure 150 formed in the first middle connection region 30a, and FIG. 5 illustrates the middle connection structure 150 formed in the second middle connection region 30b.

The middle connection structure 150 may be formed to have a different width or length according to different middle connection region 30 in which the middle connection structure 150 is formed. A plurality of middle connection structures 150 may be formed to have different areas. For example, the middle connection structure 150 formed in the first middle connection region 30a may be formed to have a lateral area, e.g., a length in the first direction D1, different from that of the middle connection structure 150 formed in the second middle connection region 30b.

Referring to FIGS. 3, 4A, 4B, the middle connection insulating layer 151 may be deposited on a top surface of the peripheral circuit structure 140 in an upward direction. The middle connection insulating layer 151 may be deposited on a top surface of the peripheral circuit insulating layer 145 of the peripheral circuit structure 140 in the upward direction. The stack structures 110 may be disposed on both sides of the middle connection insulating layer 151. Further, referring to FIG. 5, the middle connection insulating layer 151 of the second middle connection region 30b may be formed to have a lateral section having a tetragonal shape. Accordingly, the stack structures 110 illustrated in FIG. 5 may be disposed on both lateral sides, a front side, and a rear side of the middle connection insulating layer 151. For example, referring to FIGS. 1 and 5, the stack structures 110 may completely surround a perimeter of each middle connection insulating layer 151 in top view. A plurality of middle connection insulating layers 151 may be formed to have different lateral areas.

The middle connection insulating layer 151 may be formed to have a shape in which a lateral sectional area is reduced in an upward direction, e.g., having a gradually decreasing width from the bottom to the top in a direction oriented away from the sub-substrate 111. For example, as illustrated in FIG. 4A, a width of a bottom of the middle connection insulating layer 151 along the second direction D2, e.g., as measured between facing surfaces of the substrate trench 111*a*, may be larger than a width of a top of the middle connection insulating layer 151 along the second direction D2, e.g., as measured along a bottom surface of the mold insulating layer 118. A side surface of the middle connection insulating layer 151 may be inclined inward at a predetermined inclination angle. At least one side surface of the middle connection insulating layer 151 may be inclined at a predetermined inclination angle. More specifically, a side surface of the middle connection insulating layer 151, which is exposed over the sub-substrate 111, may be formed as an inclined surface. The inclined surface of the middle connection insulating layer 151 may be in contact with a bottom surface of the insulating inclined portion 112*b* of the interlayer insulating layer 112, which is located at a lowermost position of the stack structure 110.

A side surface of the middle connection insulating layer 151, which faces the stack structure 110, may be formed as an inclined surface. Referring to FIG. 3, side surfaces of the middle connection insulating layer 151, which are in the second direction D2 and a direction opposite to the second direction D2, may be formed as inclined surfaces. Further, referring to FIG. 5, side surfaces of the middle connection insulating layer 151, which are in the first direction D1 and a direction opposite to the first direction D1 and in the second direction D2 and the direction opposite to the second direction D2, may be formed as inclined surfaces.

A lower portion of the middle connection insulating layer 151 may be combined with the substrate trench 111*a* of the sub-substrate 111. A bottom surface of the middle connection insulating layer 151 may be in contact with the top surface of the peripheral circuit insulating layer 145. A side surface of the lower portion of the middle connection insulating layer 151 may be in contact with an inner side surface of the substrate trench 111*a*. The bottom surface of the middle connection insulating layer 151 may be substantially coplanar with the bottom surface of the sub-substrate 111.

A top surface of the middle connection insulating layer 151 may be formed to have a required area to electrically insulate the middle connection contact 152 from the stack structure 110 near the middle connection contact 152. The middle connection insulating layer 151 may be formed to have a length corresponding to at least a height of the stack structure 110. The top surface of the middle connection insulating layer 151 may be coplanar with the top surface of the stack structure 110. The middle connection insulating layer 151 may surround a side portion, e.g., an entire perimeter, of the middle connection contact 152 and electrically insulate the middle connection contact 152. The middle connection insulating layer 151 may be formed of a silicon oxide film or a low-k dielectric material.

The formation of a related middle connection insulating layer may include etching a stack structure in a trench shape to form a middle line cut and gap-filling the inside of the middle line cut with an insulating material. That is, the related middle connection insulating layer may be formed by etching the stack structure and gap-filling with an insulating material. During the process of etching the stack structure, delamination may occur between layers included in the stack structure. Further, during the process of gap-filling with the insulating material, voids may be formed in the middle connection insulating layer. In particular, when middle line cuts having different widths are gap-filled using the same process, voids may be formed in a middle connection insulating layer of a middle line cut having a relatively great width.

In contrast, according to example embodiments, since the middle connection insulating layer 151 is formed using a deposition process followed by an etching process (rather than gap-filling), a possibility of forming voids in the middle connection insulating layer 151 may be substantially reduced. In particular, even when the middle connection insulating layers 151 having different widths are formed using the same process, the possibility of forming voids in the middle connection insulating layers 151 may be reduced. Furthermore, since the stack structure 110 according to embodiments is formed after the middle connection insulating layer 151 is formed, delamination between layers may be prevented or substantially reduced.

The middle connection contact 152 may be formed to extend in the third direction D3 inside the middle connection insulating layer 151. The middle connection contact 152 may be exposed over the middle connection insulating layer 151. A plurality of middle connection contacts 152 may be spaced apart from each other in the first direction D1 or the second direction D2. A lower portion of the middle connection contact 152 may be in contact with and electrically connected to the peripheral circuit contact 144 of the peripheral circuit structure 140. An upper portion of the middle connection contact 152 may be in contact with and electrically connected to the bit line BL. The middle connection contact 152 may electrically connect the channel structure 120 and the peripheral circuit contact 144. The middle connection contacts 152 may be formed in an arrangement and number corresponding to the arrangements and numbers of the channel structures 120 and the peripheral circuit contact 144. The middle connection contact 152 may be electrically insulated from the stack structure 110 by the middle connection insulating layer 151. The middle connection contact 152 may include a conductive material, e.g., silicon or tungsten.

Next, a method of manufacturing a semiconductor memory device according to an example embodiment will be described. FIGS. 6A to 6K are views of processes of manufacturing a semiconductor memory device according to an example embodiment. Hereinafter, specific processes of a method of manufacturing a semiconductor memory device according to the present example embodiment will mainly be described, and detailed descriptions of ordinary processes will be omitted.

Figure 6A:
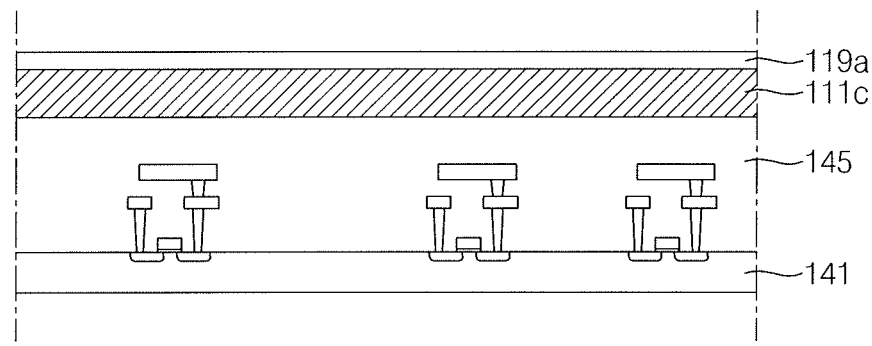
FIGS. 6A to 6K illustrate views of processes of manufacturing a semiconductor memory device according to an example embodiment.

Referring to FIGS. 6A, 4A and 1, a sub-substrate film 111*c* and an etch barrier film 119*a* may be sequentially formed on a top surface of the peripheral circuit insulating layer 145. The main substrate 141 may be formed under the peripheral circuit insulating layer 145, and the peripheral transistor 142, the peripheral circuit contact 144, and the peripheral circuit interconnection 143 may be formed on the main substrate 141, e.g., the peripheral circuit insulating layer 145 may cover the peripheral transistor 142, the peripheral circuit contact 144, and the peripheral circuit interconnection 143 on the main substrate 141. The sub-substrate film 111*c* and the etch barrier film 119*a* may be formed on a top surface of the peripheral circuit insulating layer 145 in the cell array region 10 and the middle connection region 30. Further, the sub-substrate film 111*c* and the etch barrier film 119*a* may also be formed in a region in which a peripheral connection structure is formed. The etch barrier film 119a may be formed on the entire top surface of the sub-substrate film 111c. The etch barrier film 119a may be formed of a material having an etch selectivity with respect to the middle connection insulating layer 151. For example, the middle connection insulating layer 151 may be formed of a silicon oxide film, while the etch barrier film 119a may be formed of a silicon nitride film.

Figure 6B:
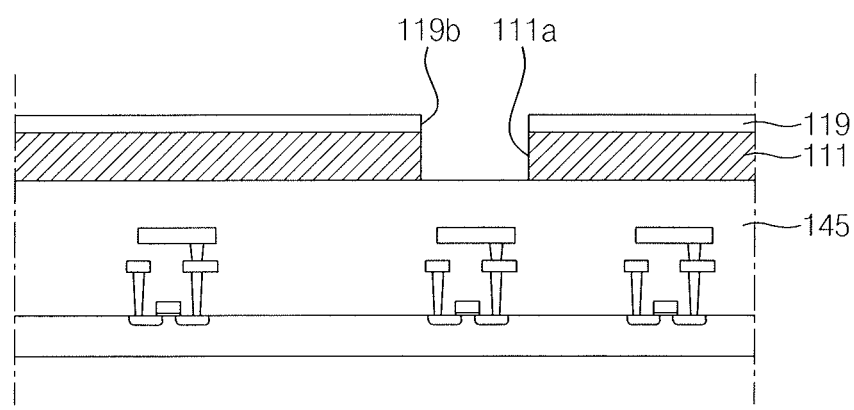

Referring to FIG. 6B, the sub-substrate film 111c and the etch barrier film 119a may be etched and patterned in a region excepting a region in which the stack structure 110 is formed, e.g., the sub-substrate film 111c and the etch barrier film 119a may be etched and patterned to form the substrate trench 111a to separate the sub-substrate 111 into portions. The sub-substrate film 111c may be formed as the sub-substrate 111, and the etch barrier film 119a may be formed as the etch barrier layer 119. The etch barrier layer 119 may be disposed on a top surface of the sub-substrate 111. The substrate trench 111a may be formed between portions of the sub-substrate 111, and a top surface of the peripheral circuit insulating layer 145 may be exposed through the substrate trench 111a. An etch trench 119b corresponding to the substrate trench 111a may be formed in the etch barrier layer 119. The substrate trench 111a may be formed in a shape corresponding to a shape of a lower portion of the middle connection insulating layer 151 to be formed in a subsequent process.

Figure 6C:
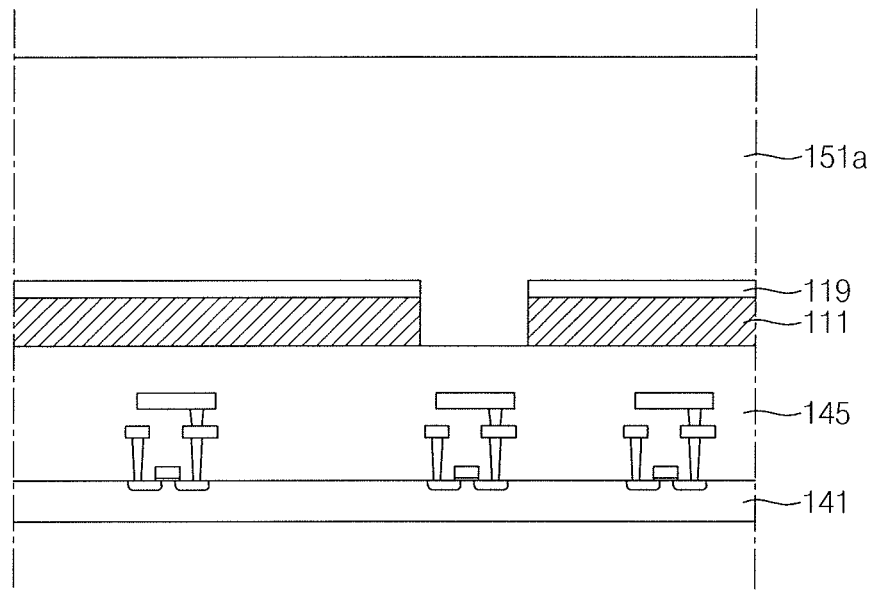

Referring to FIG. 6C, a middle connection insulating film 151a may be formed in a region including a top surface of the etch barrier layer 119, the etch trench 119b, and the substrate trench 111a. The middle connection insulating film 151a may be formed to fill the substrate trench 111a and the etch trench 119b, and have a predetermined height from the top surface of the etch barrier layer 119. The middle connection insulating film 151a may be formed to have a height greater than that of the stack structure 110. The middle connection insulating film 151a may be formed of a material having an etch selectivity with respect to the etch barrier layer 119.

Figure 6D:
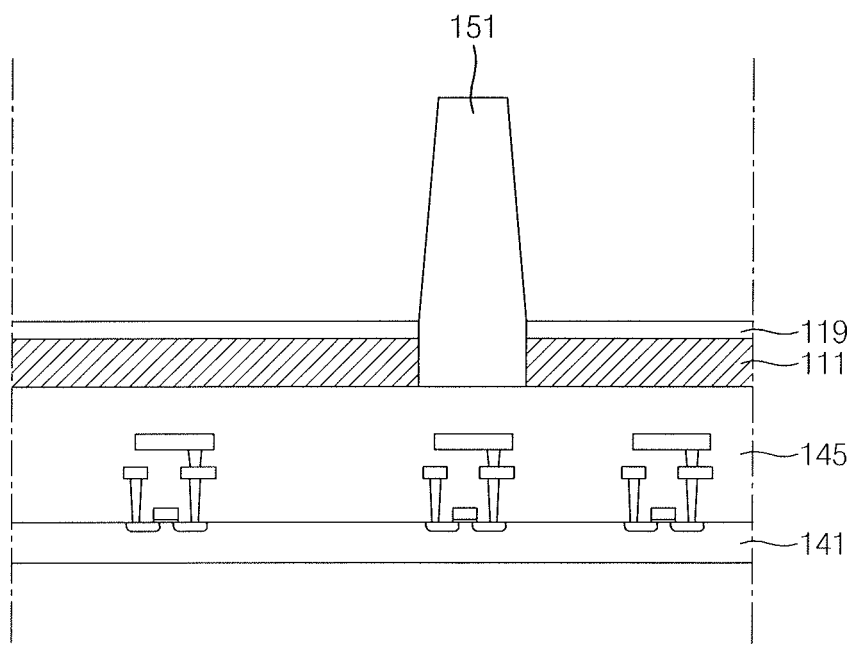

Referring to FIG. 6D, the middle connection insulating film 151a disposed on the etch barrier layer 119 may be etched, e.g., via a mask, to form the middle connection insulating layer 151. The middle connection insulating layer 151 may be formed in a bar type, which has a predetermined height and width and extends in the first direction D1. The middle connection insulating layer 151 may be formed to have a height greater than that of the stack structure 110.

Figure 6E:
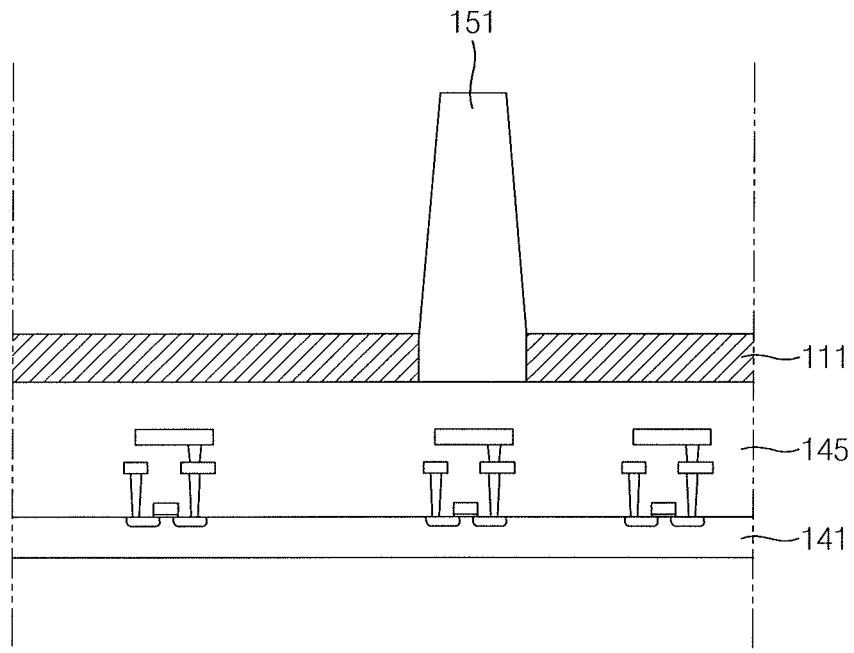

Referring to FIG. 6E, the etch barrier layer 119 may be etched and removed. During the removal of the etch barrier layer 119, the top surface of the sub-substrate 111 may be exposed.

Figure 6F:
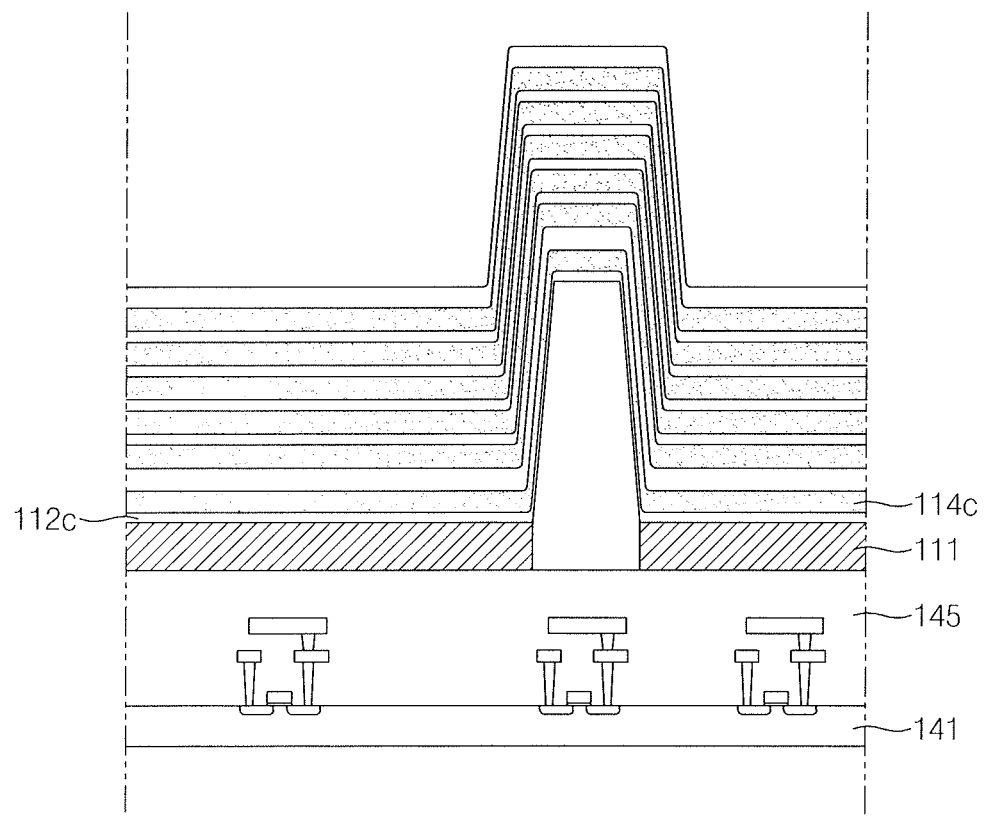

Referring to FIG. 6F, a plurality of interlayer insulating films 112c and a plurality of interlayer sacrificial films 114c may be alternately, e.g., and conformally, stacked on the top surface of the sub-substrate 111, side surfaces of the middle connection insulating layer 151, and a top surface of the middle connection insulating layer 151, e.g., via deposition. An uppermost interlayer insulating film 112c may be formed as an etch barrier film 119a. That is, the uppermost interlayer insulating film 112c may be formed as the etch barrier film 119a having an etch selectivity with respect to the middle connection insulating layer 151. The interlayer sacrificial films 114c may be formed in a number corresponding to the number of gate electrodes 113 included in the stack structure 110. The interlayer insulating films 112c and the interlayer sacrificial films 114c may be formed in the same way on the top surface of the sub-substrate 111 and the top surface of the middle connection insulating layer 151. The interlayer insulating films 112c and the interlayer sacrificial films 114c may also be formed in the same way on the side surfaces of the middle connection insulating layer 151.

However, the interlayer insulating films 112c and the interlayer sacrificial films 114c formed on the side surfaces of the middle connection insulating layer 151 may be inclined with respect to the top surface of the sub-substrate 111 and formed to thicknesses smaller than those of other portions. Each of the interlayer insulating films 112c and the interlayer sacrificial films 114c may include a lateral portion formed on the top surface of the sub-substrate 111, an inclined portion formed on the side surfaces of the middle connection insulating layer 151, and a lateral portion formed on the top surface of the middle connection insulating layer 151. The uppermost interlayer insulating film 112c formed over the sub-substrate 111 may be formed to have a height smaller than that of the middle connection insulating layer 151.

Figure 6G:
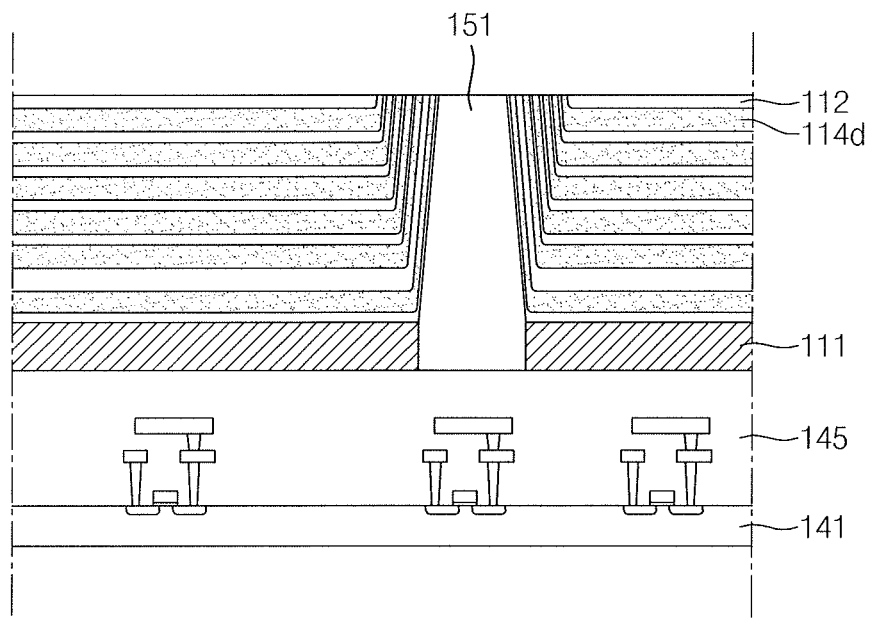

Referring to FIG. 6G, the interlayer insulating films 112c and the interlayer sacrificial films 114c stacked on the top surface and the side surfaces of the middle connection insulating layer 151 may be etched based on the height of the uppermost interlayer insulating film 112c formed over the sub-substrate 111, e.g., to expose a top surface of the middle connection insulating layer 151. In this case, a portion of the uppermost interlayer insulating film 112c formed over the sub-substrate 111 may also be etched. The etching process may be performed using a chemical mechanical polishing (CMP) process. In addition, before the CMP process, the protruding interlayer insulating films 112c and the protruding interlayer sacrificial films 114c, which are formed on the middle connection insulating layer 151, may be partially removed using an etching process. When the protruding interlayer insulating films 112c and the protruding interlayer sacrificial films 114c are first partially removed, the interlayer insulating films 112c and the interlayer sacrificial films 114c may be efficiently uniformly etched during the CMP process.

Since the interlayer insulating films 112c and the interlayer sacrificial films 114c are partially etched, an upper portion of the sub-substrate 111 and an upper portion of the middle connection insulating layer 151 may entirely form a planar surface. The interlayer insulating films 112c may be formed as interlayer insulating layers 112, while the interlayer sacrificial films 114c may be formed as interlayer sacrificial layers 114d. The interlayer insulating layers 112 may be exposed to be spaced apart from each other by a distance corresponding to a width of the substrate trench 111a over the sub-substrate 111, and the top surface of the middle connection insulating layer 151 may be exposed between the interlayer insulating layers 112. Further, side-sectional surfaces of the interlayer insulating layers 112 and the interlayer sacrificial layers 114d may be exposed between the interlayer insulating layers 112 and the middle connection insulating layer 151. That is, since the interlayer insulating layers 112 and the interlayer sacrificial layers 114d formed on the side surfaces of the middle connection insulating layer 151 are formed to be inclined, the side-sectional surfaces of the interlayer insulating layers 112 and the interlayer sacrificial layers 114d may be exposed when etched in a lateral direction.

Figure 6H:
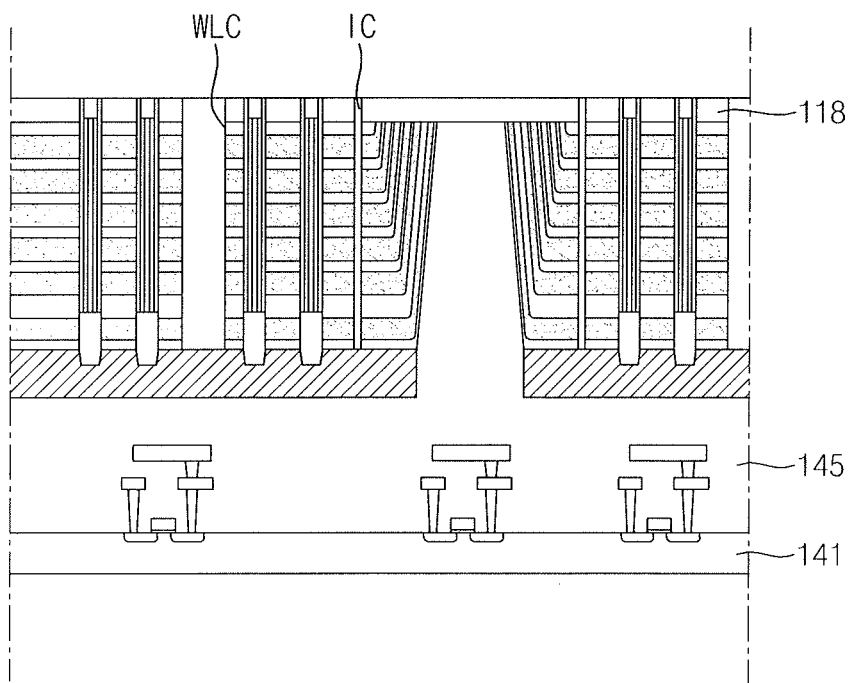

Referring to FIGS. 6H and 4A, the channel structures 120 may be formed to pass through the interlayer insulating layers 112 and the interlayer sacrificial layers 114d and extend in the third direction D3. The channel structures 120 may be formed using a typical method, and a detailed description thereof will be omitted. Word line cuts WLC may be formed between the channel structures 120 and extend in the first direction D1. Isolation cuts IC may be formed at positions adjacent to the middle connection structure 150 in the lateral portions of the interlayer insulating layers 112 and the interlayer sacrificial layers 114d disposed on the top surface of the sub-substrate 111, and may extend in a direction parallel to the side surfaces of the middle connection insulating layer 151. The isolation cuts IC may extend in the first direction D1 in the same manner of the word line cuts WLC. The isolation cuts IC may be formed using the same process as the word line cuts WLC.

Figure 6I:
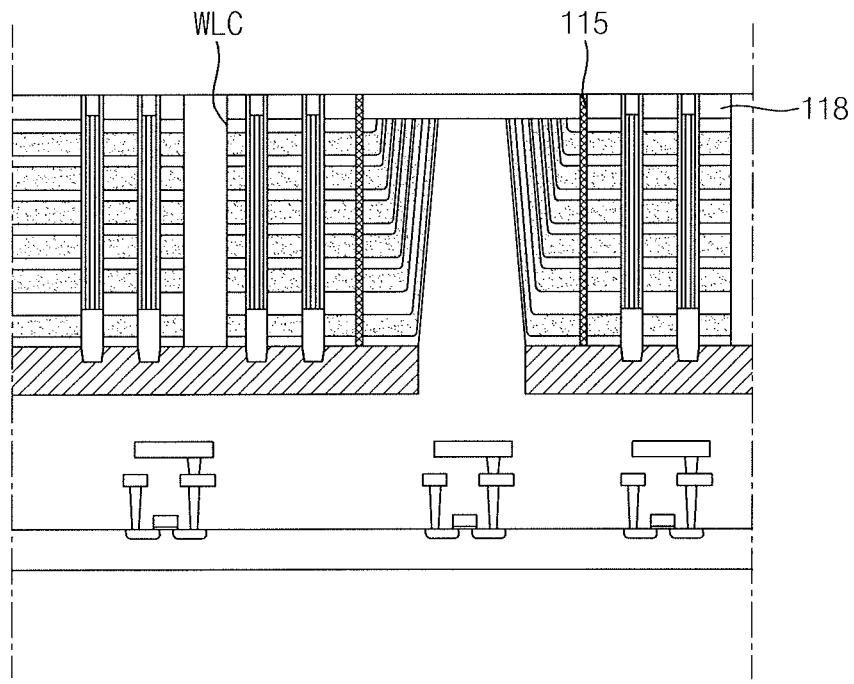

Referring to FIG. 6I, the isolation cuts IC may be filled with an insulating material to form the isolation walls 115. The isolation walls 115 may be formed using an ALD process. The isolation walls 115 may be formed of a material having an etch selectivity with respect to the interlayer sacrificial film 114c. The isolation walls 115 may be formed on the top surface of the sub-substrate 111 or may be formed to have a predetermined depth from the top surface of the sub-substrate 111. In this case, the word line cuts WLC may remain unfilled.

Figure 6J:
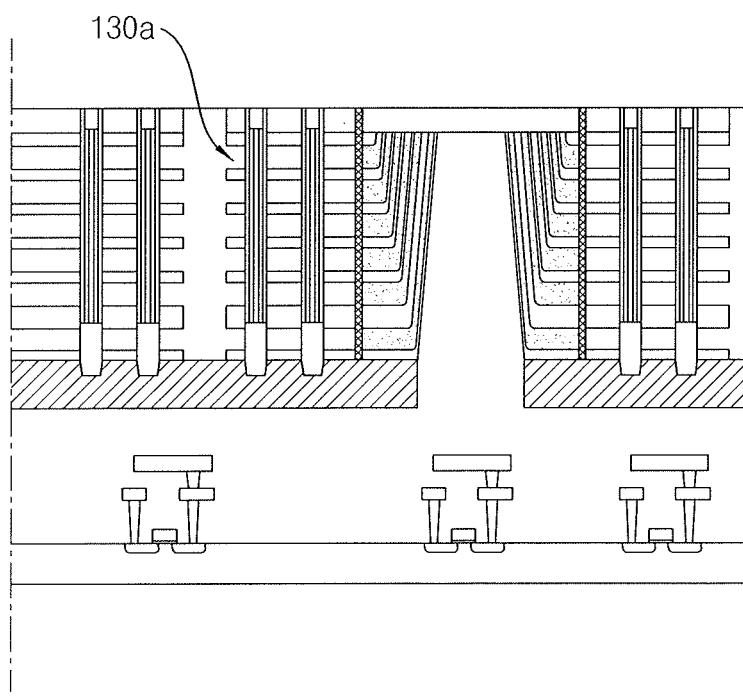

Referring to FIG. 6J, the interlayer sacrificial layers 114d exposed by the word line cuts WLC may be removed to form trench openings 130a. The interlayer sacrificial layers 114d may be selectively etched with respect to the isolation walls 115. That is, when the interlayer sacrificial layers 114d are etched, the isolation walls 115 may not be etched. The trench openings 130a may expose partial sidewalls of the channel structures 120, top and bottom surfaces of the interlayer insulating layers 112, and partial sidewalls of the isolation walls 115. Portions of the interlayer sacrificial layers 114d, which are disposed toward the word line cuts WLC with respect to the isolation walls 115, may be etched. In addition, portions of the interlayer sacrificial layers 114d, which are disposed toward the middle connection insulating layer 151 with respect to the isolation walls 115, may not be etched but formed as interlayer support layers 114. The interlayer insulating layers 112 disposed toward the word line cuts WLC may be supported by the channel structures 120 during the removal of the interlayer sacrificial layers 114d, so that a distance between the interlayer insulating layers 112 may be maintained. The interlayer insulating layers 112 disposed toward the middle connection insulating layer 151 may be supported by the interlayer support layers 114.

Since the channel structures 120 are not formed between the isolation walls 115 and the middle connection insulating layer 151, when the interlayer sacrificial layers 114d are etched, the interlayer insulating layers 112 could collapse without the presence of the isolation walls 115. However, formation of the isolation walls 115 may inhibit the etching of the interlayer support layers 114 disposed between the isolation walls 115 and the middle connection insulating layer 151 and prevent the interlayer insulating layers 112 from collapsing.

The interlayer sacrificial layers 114d may be removed using an isotropic etching process. The etching process may be performed using an etchant having an etch selectivity with respect to the interlayer insulating layers 112 and the isolation walls 115. For example, when the interlayer sacrificial layers 114d are formed of a silicon nitride film, and the interlayer insulating layers 112 and the isolation walls 115 are formed of a silicon oxide film, the etching process may be performed using an etchant containing a phosphoric acid.

Figure 6K:
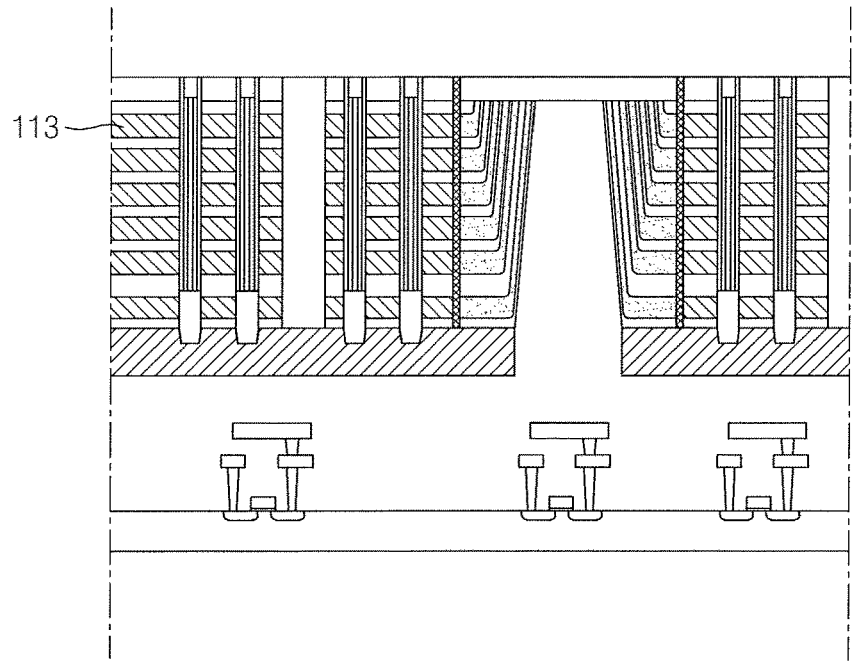

Referring to FIG. 6K, the gate electrodes 113 may be formed to fill the word line cuts WLC and the trench openings 130a. Although not specifically shown, gate electrode films 113a may be formed to fill the trench openings 130a in which the interlayer sacrificial films 114c were located. The gate electrode films 113a formed in the word line cuts WLC may be patterned to form the gate electrodes 113. The gate electrodes 113 disposed in a vertical direction may be electrically isolated from each other by the interlayer insulating layers 112. Accordingly, the interlayer insulating layers 112 and the gate electrodes 113 may be alternately stacked on the sub-substrate 111.

Referring back to FIG. 5, the common source lines 130 including the common source plugs 131 and the common source spacers 132 may be formed to fill the word line cuts WLC. Initially, an insulating film may be deposited in the word line cuts WLC, and an anisotropic etching process may be performed to form the common source spacers 132. Next, inner spaces of the common source spacers 132 may be filled with a conductive material, e.g., tungsten, to form the common source plugs 131.

Next, a semiconductor memory device according to an example embodiment will be described.

Figure 7A:
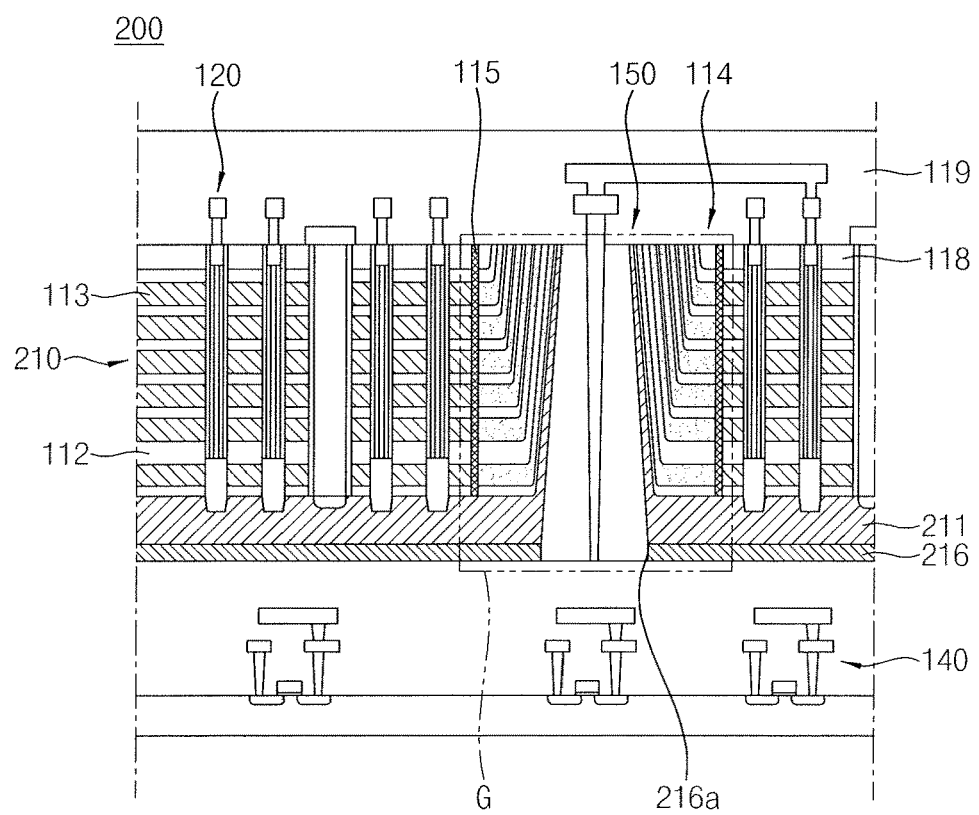
FIG. 7A illustrates a vertical sectional view of a semiconductor memory device, which corresponds to FIG. 4A, according to an example embodiment.
Figure 7B:
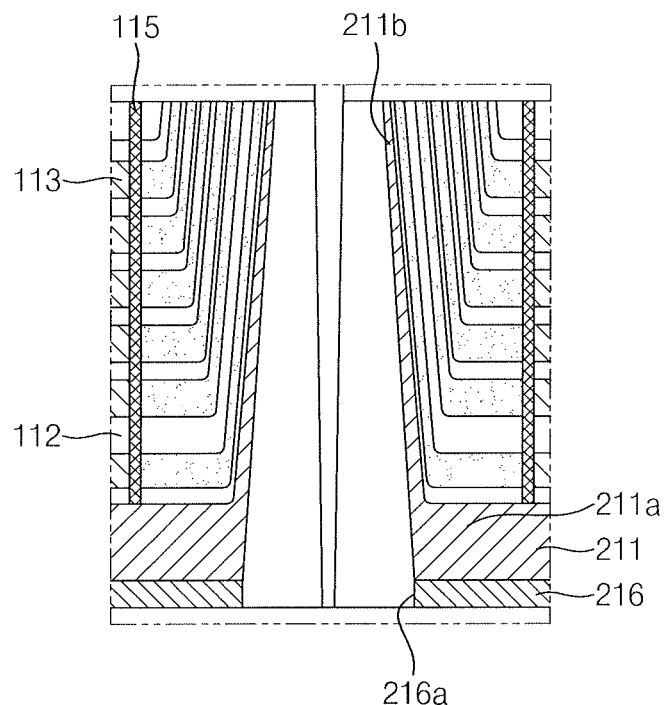
FIG. 7B illustrates an enlarged view of portion G of FIG. 7A.

Referring to FIGS. 7A, 7B, and 4A, a semiconductor memory device 200 according to the example embodiment may include stack structures 210, channel structures 120, common source lines 130, peripheral circuit structures 140, and the middle connection structure 150. In the semiconductor memory device 200 according to the example embodiment, the stack structure 210 may be formed in a different way than in the semiconductor memory device 100 according to the example embodiment shown in FIGS. 1 to 5. Hereinafter, the stack structure 210 of the semiconductor memory device 200 according to the example embodiment will mainly be described.

The stack structure 210 may include a lower etch barrier layer 216, a sub-substrate 211, the interlayer insulating layers 112, the gate electrodes 113, and the interlayer support layers 114. The stack structure 210 may further include the isolation walls 115. In the stack structure 210, the lower etch barrier layer 216 and the sub-substrate 211 may be formed to have different structures than in the semiconductor memory device according to the example embodiment shown in FIGS. 1 to 5. Accordingly, the lower etch barrier layer 216 and the sub-substrate 211 will now be mainly described. Further, specific descriptions of the gate electrodes 113, the interlayer support layers 114, and the isolation wall 115 will be omitted.

The stack structure 210 may include a plurality of layers. A lowermost layer of the stack structure 210 may be the lower etch barrier layer 216, and a second lowermost layer of the stack structure 210 may be the sub-substrate 211. Further, the interlayer insulating layers 112 and gate electrodes 113 may be alternately stacked on the sub-substrate 211. A bottom surface of the lower etch barrier layer 216, which is the lowermost layer of the stack structure 210, may be in contact with a top surface of the peripheral circuit insulating layer 145 included in the peripheral circuit structure 140. A bottom surface of the sub-substrate 211, which is the second lowermost layer of the stack structure 210, may be in contact with a top surface of the lower etch barrier layer 216 and side surfaces of the middle connection insulating layer 151 of the middle connection structure 150.

The lower etch barrier layer 216 may be deposited on the top surface of the peripheral circuit insulating layer 145 of the peripheral circuit structure 140. The lower etch barrier layer 216 may include a lower etch trench 216a, which may be formed to pass through the lower etch barrier layer 216 from the top surface of the lower etch barrier layer 216 to the bottom surface thereof. The lower etch trench 216a may have a predetermined width and extend in the first direction D1. The lower etch trench 216a may be formed in a region in which the middle connection structure 150 is formed. The lower etch trench 216a may expose the top surface of the peripheral circuit insulating layer 145 of the peripheral circuit structure 140. The lower etch barrier layer 216 may be formed of a silicon oxide film or a silicon nitride film.

The sub-substrate 211 may include a substrate lateral portion 211a and a substrate inclined portion 211b. The substrate lateral portion 211a may be formed on the top surface of the lower etch barrier layer 216. The substrate inclined portion 211b may be formed to be inclined at a predetermined inclination angle with respect to the substrate lateral portion 211a in an upward direction. In this case, the substrate inclined portion 211b may be formed to be inclined in an upward direction of the lower etch trench 216a. The substrate inclined portion 211b may be formed to be inclined at an angle corresponding to an inclination angle of the middle connection insulating layer 151. The inclination angle of the substrate inclined portion 211b may correspond to an inclination of side surfaces of the middle connection structure 150. A side-sectional surface of the substrate inclined portion 211b may be exposed at the top surface of the stack structure 110. That is, one lateral side of the substrate inclined portion 211b may be connected to the substrate lateral portion 211a, while another lateral side of the substrate inclined portion 211b may extend upward to be inclined at an inclination angle and exposed at the top surface of the stack structure 210.

The interlayer insulating layers 112 may include a plurality of insulating layers, e.g., 112-1, 112-2, 112-3, 112-4, 112-5, and 112-6. The interlayer insulating layer 112 may be stacked on the sub-substrate 211. The interlayer insulating layer 112 may include the insulating lateral portion 112a and the insulating inclined portion 112b. The insulating lateral portion 112a may be a portion formed parallel to the substrate lateral portion 211a. That is, the insulating lateral portions 112a may be formed on a top surface of the substrate lateral portion 211a and above the substrate lateral portion 211a to be spaced apart from each other. The insulating inclined portion 112b may be a portion formed parallel to the substrate inclined portion 211b. The insulating inclined portions 112b may be formed on a top surface of the substrate inclined portion 211b and above the substrate inclined portion 211b to be spaced apart from each other.

Next, a method of manufacturing a semiconductor memory device according to an example embodiment will be described.

FIGS. 8A to 8E are views of processes of manufacturing a semiconductor memory device according to an example embodiment. Hereinafter, specific processes of a method of manufacturing a semiconductor memory device according to the present example embodiment will mainly be described, and detailed descriptions of the same processes as in the method according to the example embodiment described with reference to FIGS. 6A to 6K and ordinary processes will be omitted.

Figure 8A:
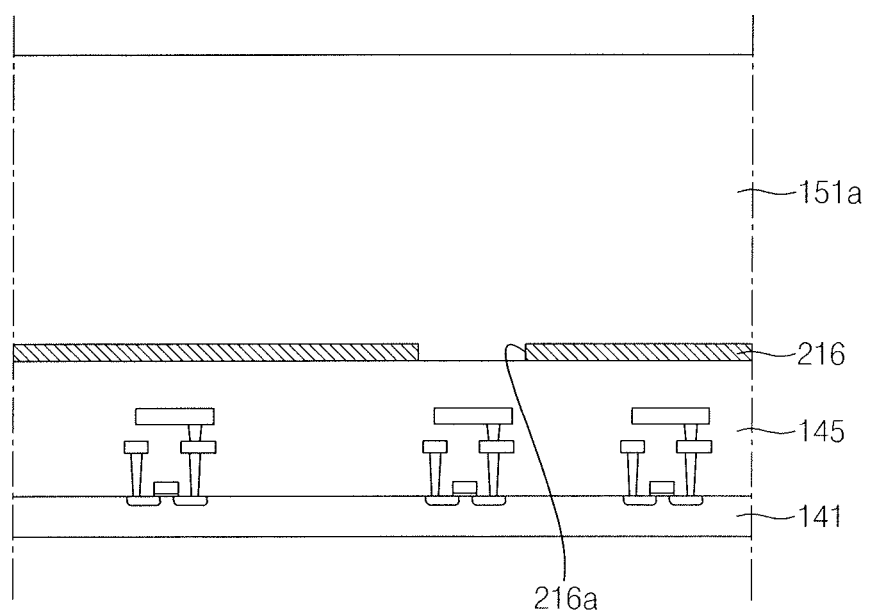
FIGS. 8A to 8E illustrate views of processes of manufacturing a semiconductor memory device according to an example embodiment.

Referring to FIG. 8A, the lower etch barrier film 216b may be formed on a top surface of the peripheral circuit insulating layer 145. The lower etch barrier film 216b may be formed in a region in which the stack structure 210 and the middle connection structure 150 will be formed, on the top surface of the peripheral circuit insulating layer 145. Although not specifically shown, the lower etch barrier film 216b may also be formed in a region in which a peripheral connection structure will be formed. The lower etch barrier film 216b may be formed of a material having an etch selectivity with respect to a middle connection insulating layer 151. For example, the middle connection insulating layer 151 may be formed of a silicon oxide film, while the lower etch barrier film 216b may be formed of a silicon nitride film.

A region of the lower etch barrier film 216b, which corresponds to the middle connection insulating layer 151, may be etched to form the lower etch trench 216a. Accordingly, the lower etch barrier film 216b may be formed as the lower etch barrier layer 216. The lower etch trench 216a may expose a top surface of the peripheral connection structure.

A middle connection insulating film 151a may be formed in a region including the lower etch barrier layer 216 and the lower etch trench 216a. The middle connection insulating film 151a may fill the lower etch trench 216a and may be formed on the lower etch barrier layer 216 to have a predetermined height. The middle connection insulating film 151a may be formed to have a height greater than that of the stack structure 210. The middle connection insulating film 151a may be formed of a material having an etch selectivity with respect to the lower etch barrier layer 216.

Figure 8B:
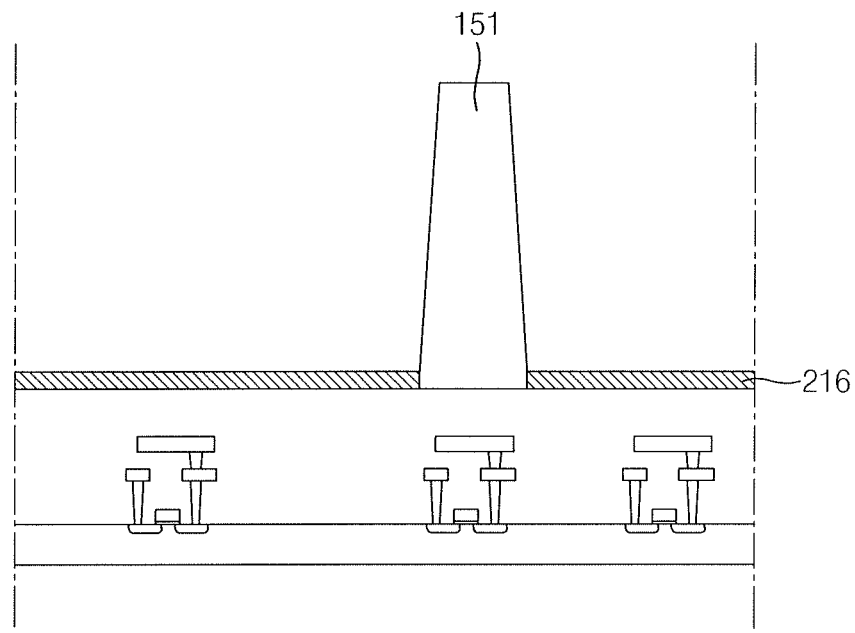

Referring to FIG. 8B, a region of the middle connection insulating film 151a, in which the lower etch barrier layer 216 is formed, may be etched to form the middle connection insulating layer 151. The middle connection insulating layer 151 may be formed in a region excepting a top surface of the lower etch barrier layer 216. The middle connection insulating layer 151 may be formed in a bar type, which has a predetermined height and width and extends in the first direction D1.

Figure 8C:
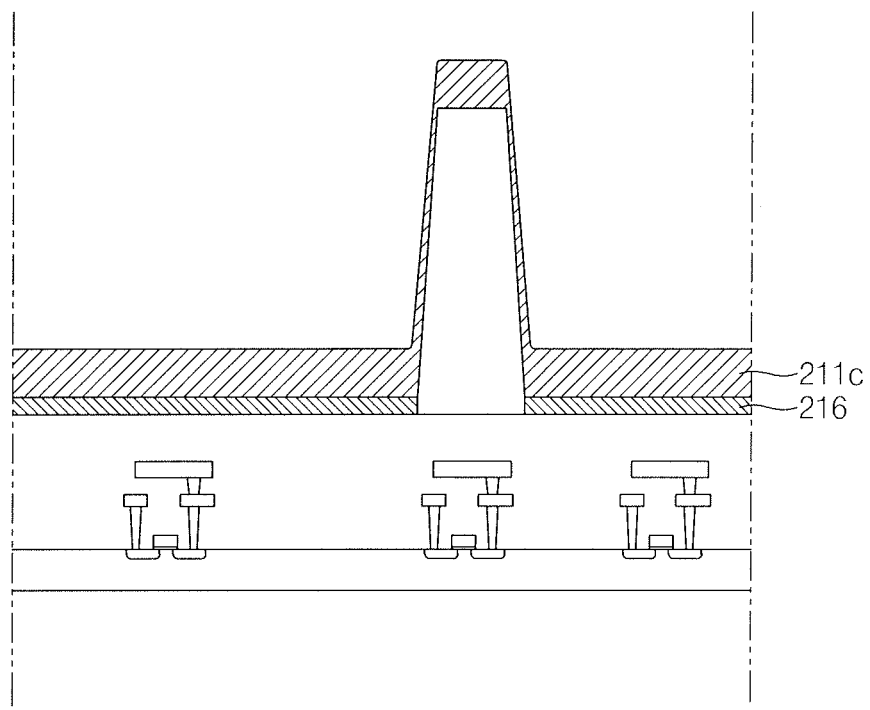

Referring to FIG. 8C, a sub-substrate film 211c may be formed on the top surface of the lower etch barrier layer 216, side surfaces of the middle connection insulating layer 151, and a top surface of the middle connection insulating layer 151. The sub-substrate film 211c may include a substrate lateral portion 211a and a substrate inclined portion 211b. The substrate lateral portion 211a may be formed on the top surface of the lower etch barrier layer 216 and the top surface of the middle connection insulating layer 151. The substrate inclined portion 211b may be formed on side surfaces of the middle connection insulating layer 151.

Figure 8D:
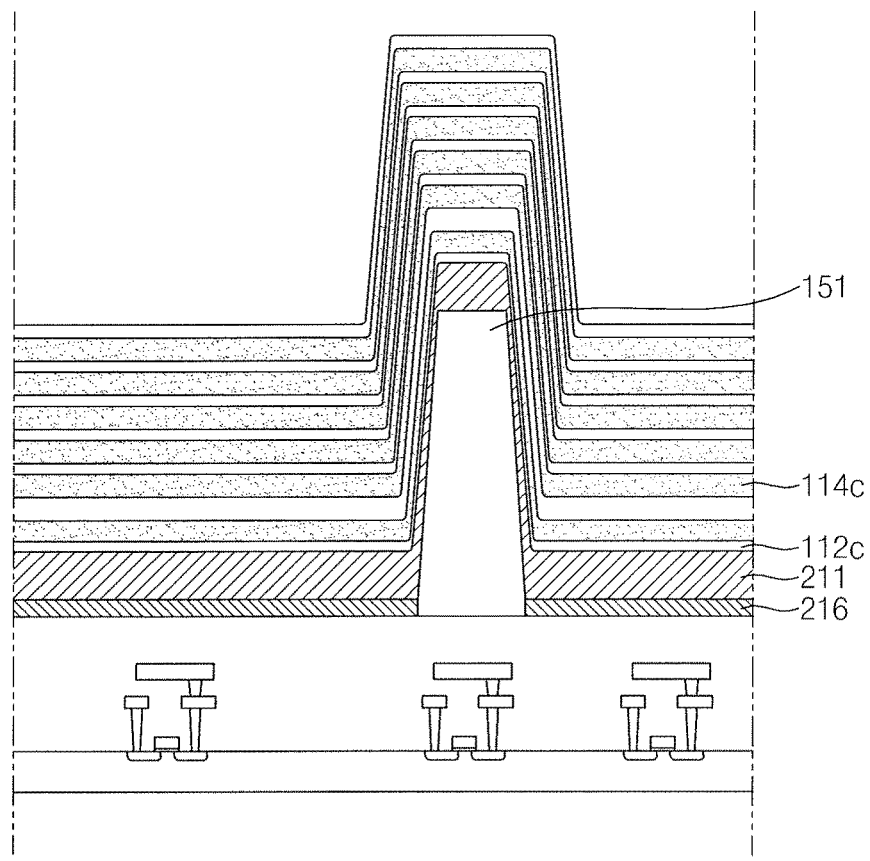

Referring to FIG. 8D, a plurality of interlayer insulating films 112c and a plurality of interlayer sacrificial films 114c may be alternately formed on a top surface of the sub-substrate film 211c. The interlayer sacrificial films 114c may be formed in a number corresponding to the number of gate electrodes 113 included in the stack structure 210. Each of the interlayer insulating films 112c and the interlayer sacrificial films 114c may include a lateral portion and an inclined portion in the same manner of the sub-substrate film 211c. An uppermost interlayer insulating film 112c of the interlayer insulating films 112c may be formed as an etch barrier film. The uppermost interlayer insulating film 112c formed over the lower etch barrier layer 216 may have a height smaller than a height of the middle connection insulating layer 151.

Figure 8E:
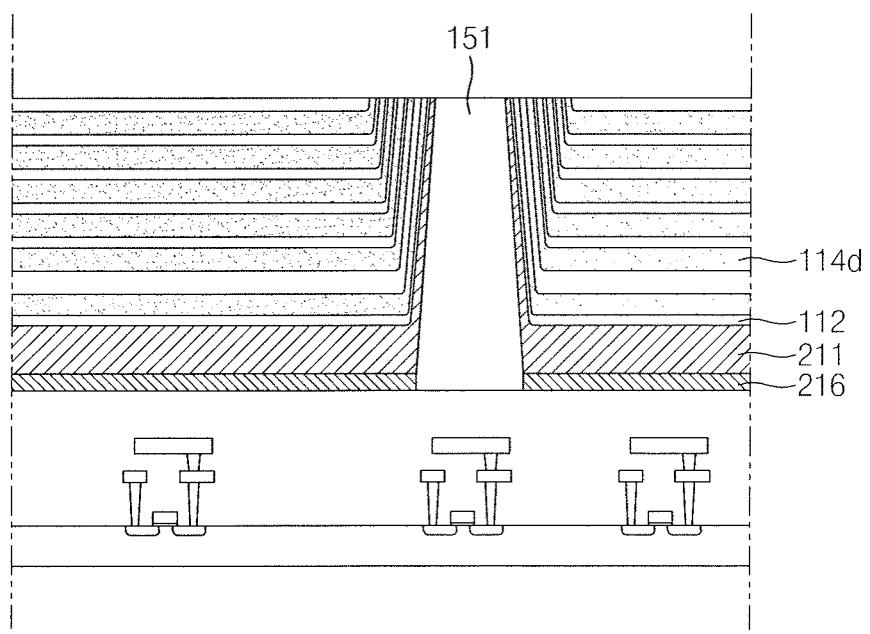

Referring to FIG. 8E, the sub-substrate film 211c, the interlayer insulating film 112c, and the interlayer sacrificial film 114c, which may be stacked on the top surface and the side surfaces of the middle connection insulating layer 151, may be etched based on the height of the uppermost interlayer insulating film 112c. In this case, a portion of the uppermost interlayer insulating film 112c may also be etched. The sub-substrate film 211c and the interlayer insulating film 112c may be formed as a sub-substrate 211 and an interlayer insulating layer 112.

An upper portion of the lower etch barrier layer 216 and an upper portion of the middle connection insulating layer 151 may entirely form a planar surface. Further, a top surface of the interlayer insulating layer 112 and the top surface of the middle connection insulating layer 151 may be exposed. In addition, side-sectional surfaces of the sub-substrate 211, the interlayer insulating layer 112, and the interlayer sacrificial films 114c may be exposed. That is, since the sub-substrate 211, the interlayer insulating layer 112, and the interlayer sacrificial films 114c, which are formed on the side surfaces of the middle connection insulating layer 151, are formed to be inclined, the side-sectional surfaces of the sub-substrate 211, the interlayer insulating layer 112, and the interlayer sacrificial films 114c may be exposed when etched in a lateral direction.

Subsequent processes may be performed in the same manner of the processes described with reference to FIGS. 6H to 6K, and detailed descriptions thereof will be omitted here.

By way of summation and review, example embodiments are directed to providing a semiconductor memory device having high integration density and improved reliability and a method of manufacturing the device. That is, according to the example embodiments, since a connection region between cell array regions is formed using a stacking process, delamination occurring in the cell array regions can be prevented, and voids being formed in the connection region can be prevented. Thus, semiconductor memory devices having high integration density and improved reliability can be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a peripheral circuit structure including a peripheral circuit insulating layer;
a middle connection structure on the peripheral circuit insulating layer, the middle connection structure including a middle connection insulating layer, and a bottom surface of the middle connection insulating layer is in contact with a top surface of the peripheral circuit insulating layer;
stack structures on sides of the middle connection structure; and
channel structures extending vertically through each of the stack structures,
wherein at least one side surface of the middle connection insulating layer is an inclined surface, a lateral sectional area of the middle connection insulating layer decreasing in an upward direction oriented away from the peripheral circuit insulating layer.

2. The semiconductor memory device as claimed in claim 1, wherein each of the stack structures includes:
a sub-substrate having a substrate trench connected to a lower portion of the middle connection insulating layer;
interlayer insulating layers stacked on the sub-substrate and spaced apart from each other;
gate electrodes stacked alternately with the interlayer insulating layers above the sub-substrate;
interlayer support layers between the interlayer insulating layers, and between the gate electrodes and the middle connection insulating layer; and
isolation walls vertically passing through the interlayer insulating layers, the isolation walls being between the gate electrodes and the interlayer support layers.

3. The semiconductor memory device as claimed in claim 2, wherein:
each of the interlayer insulating layers includes an insulating lateral portion parallel to the sub-substrate, and an insulating inclined portion connected to the insulating lateral portion and parallel to the inclined surface of the middle connection insulating layer, and
each of the interlayer support layers includes a support lateral portion parallel to the insulating lateral portion, and a support inclined portion connected to the support lateral portion and parallel to the insulating inclined portion.

4. The semiconductor memory device as claimed in claim 2, wherein:
a lower side surface of the middle connection insulating layer is in contact with an inner side surface of the substrate trench, and
a side surface of the middle connection insulating layer, which is exposed over the sub-substrate, is the inclined surface.

5. The semiconductor memory device as claimed in claim 2, wherein the isolation walls are parallel to the channel structures.

6. The semiconductor memory device as claimed in claim 2, wherein the isolation walls extend to a top surface of the sub-substrate or to a predetermined depth from the top surface of the sub-substrate.

7. The semiconductor memory device as claimed in claim 2, wherein the isolation walls include a material having an etch selectivity with respect to the interlayer support layers.

8. The semiconductor memory device as claimed in claim 2, wherein an uppermost interlayer insulating layer of the interlayer insulating layers is an etch barrier layer having an etch selectivity with respect to the middle connection insulating layer.

9. The semiconductor memory device as claimed in claim 1, wherein each of the stack structures includes:
a lower etch barrier layer having a lower etch trench connected to a lower portion of the middle connection insulating layer;
a sub-substrate on the lower etch barrier layer;
interlayer insulating layers stacked on the sub-substrate to be spaced apart from each other;
gate electrodes stacked alternately with the interlayer insulating layers above the sub-substrate;
interlayer support layers between the interlayer insulating layers, and between the gate electrodes and the middle connection insulating layer; and
isolation walls vertically passing through the interlayer insulating layers, the isolation walls being between the gate electrodes and the interlayer support layers.

10. The semiconductor memory device as claimed in claim 9, wherein:
the sub-substrate includes a substrate lateral portion parallel to the lower etch barrier layer, and a substrate inclined portion connected to the substrate lateral portion and parallel to the inclined surface of the middle connection insulating layer, each of the interlayer insulating layers includes an insulating lateral portion parallel to the substrate lateral portion, and an insulating inclined portion connected to the insulating lateral portion and parallel to the substrate inclined portion, and each of the interlayer support layers includes a support lateral portion parallel to the insulating lateral portion, and a support inclined portion connected to the support lateral portion and parallel to the insulating inclined portion.

11. The semiconductor memory device as claimed in claim 1, wherein the middle connection insulating layer includes a plurality of middle connection insulating layers having different lateral areas.

12. A semiconductor memory device, comprising:
a peripheral circuit structure including a peripheral circuit insulating layer;
a middle connection structure on the peripheral circuit insulating layer and including a middle connection insulating layer, the middle connection insulating layer having a decreasing width in an upward direction oriented away from the peripheral circuit insulating layer, as viewed in a lateral sectional area;
stack structures on sides of the middle connection insulating layer above the peripheral circuit insulating layer, each of the stack structures including a plurality of layers, a bottom surface of a lowermost layer of the plurality of layers in each of the stack structures being in contact with a top surface of the peripheral circuit insulating layer, and a bottom surface of a second lowermost layer of the plurality of layers in each of the stack structures being in contact with a top surface of the lowermost layer and a side surface of the middle connection insulating layer; and
channel structures vertically passing through the stack structures.

13. The semiconductor memory device as claimed in claim 12, wherein:
the lowermost layer of each of the stack structures is a sub-substrate including a substrate trench, and the second lowermost layer of each of the stack structures is an interlayer insulating layer, and
a lower portion of the middle connection insulating layer is combined with the substrate trench, and a bottom surface of the middle connection insulating layer is in contact with the top surface of the peripheral circuit insulating layer.

14. The semiconductor memory device as claimed in claim 13, wherein gate electrodes and interlayer insulating layers are alternately stacked on the sub-substrate, and
the semiconductor memory device further including:
interlayer support layers between the interlayer insulating layers, and between the gate electrodes and the middle connection insulating layer; and
isolation walls vertically passing through the interlayer insulating layers, the isolation walls being between the gate electrodes and the interlayer support layers.

15. The semiconductor memory device as claimed in claim 12, wherein:
the lowermost layer of each of the stack structures is a lower etch barrier layer including a lower etch trench, and the second lowermost layer of each of the stack structures is a sub-substrate, and a lower portion of the middle connection insulating layer is combined with the lower etch trench, and a bottom surface of the middle connection insulating layer is in contact with the top surface of the peripheral circuit insulating layer.

16. The semiconductor memory device as claimed in claim 15, wherein interlayer insulating layers and gate electrodes are alternately stacked on the sub-substrate, and
the semiconductor memory device further including:
interlayer support layers between the interlayer insulating layers, and between the gate electrodes and the middle connection insulating layer; and
isolation walls vertically passing through the interlayer insulating layers, the isolation walls being between the gate electrodes and the interlayer support layers.

17. A method of manufacturing a semiconductor memory device, the method comprising:
depositing a middle connection insulating layer on a top surface of a peripheral circuit insulating layer;
forming stack structures on sides of the middle connection insulating layer; and
forming channel structures configured to vertically pass through the stack structures,
wherein a bottom surface of the middle connection insulating layer is in contact with the top surface of the peripheral circuit insulating layer, and a lateral sectional area of the middle connection insulating layer is reduced upward such that at least one side surface of the middle connection insulating layer is formed as an inclined surface.

18. The method as claimed in claim 17, wherein forming the stack structures includes:
sequentially forming a sub-substrate film and an etch barrier film on the top surface of the peripheral circuit insulating layer;
patterning the sub-substrate film and the etch barrier film to form a sub-substrate and an etch barrier layer, the sub-substrate including a substrate trench and the etch barrier layer disposed on a top surface of the sub-substrate;
forming a middle connection insulating film on a region including a top surface of the etch barrier layer and the substrate trench and etching the middle connection insulating film disposed on the etch barrier layer to form the middle connection insulating layer;
removing the etch barrier layer and alternately stacking interlayer insulating films and interlayer sacrificial films on the top surface of the sub-substrate and side surfaces and a top surface of the middle connection insulating layer;
etching the interlayer insulating films and the interlayer sacrificial films stacked on the top surface and the side surfaces of the middle connection insulating layer based on a height of an uppermost interlayer insulating film of the interlayer insulating films formed on the sub-substrate to form an interlayer insulating layer and an interlayer sacrificial layer;
forming the channel structures configured to vertically pass through the interlayer insulating layer and the interlayer sacrificial layer and forming isolation walls on lateral portions of the interlayer insulating layer and the interlayer sacrificial layer disposed on the top surface of the sub-substrate in a direction parallel to the side surfaces of the middle connection insulating layer;
removing a portion of the interlayer sacrificial layer disposed on an opposite side of the middle connection insulating layer with respect to the isolation walls; and forming a gate electrode in the removed portion of the interlayer sacrificial layer and forming the remaining portion of the interlayer sacrificial layer as an interlayer support layer.

19. The method as claimed in claim 18, wherein the interlayer sacrificial films are selectively etched with respect to the isolation walls.

20. The method as claimed in claim 17, wherein forming the stack structure includes:
- depositing a lower etch barrier film on the top surface of the peripheral circuit insulating layer and etching a portion of the lower etch barrier film corresponding to the middle connection insulating layer to form a lower etch barrier layer including a lower etch trench;
- forming a middle connection insulating film on a region including the lower etch barrier layer and the lower etch trench;
- etching a region of the middle connection insulating film in which the lower etch barrier layer is formed to form the middle connection insulating layer;
- forming a sub-substrate film on a top surface of the lower etch barrier layer and side surfaces and a top surface of the middle connection insulating layer;
- alternately forming interlayer insulating films and interlayer sacrificial films on a top surface of the sub-substrate film; and
- etching the sub-substrate film, the interlayer insulating films, and the interlayer sacrificial films, which are stacked on the top surface and the side surfaces of the middle connection insulating layer, based on a height of an uppermost interlayer insulating film of the interlayer insulating films formed over the lower etch barrier layer.

* * * * *